(12) United States Patent
Son et al.

(10) Patent No.: US 8,492,828 B2
(45) Date of Patent: *Jul. 23, 2013

(54) VERTICAL-TYPE NON-VOLATILE MEMORY DEVICES

(75) Inventors: Yong-Hoon Son, Yongin-si (KR); Jong-Wook Lee, Yongin-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/567,299

(22) Filed: Aug. 6, 2012

(65) Prior Publication Data

US 2012/0292686 A1 Nov. 22, 2012

Related U.S. Application Data

(63) Continuation of application No. 12/686,065, filed on Jan. 12, 2010, now Pat. No. 8,236,650, which is a continuation of application No. 12/290,742, filed on Nov. 3, 2008, now Pat. No. 7,679,133.

(30) Foreign Application Priority Data

Nov. 8, 2007 (KR) .................. 10-2007-0113535

(51) Int. Cl.
*H01L 29/94* (2006.01)
*H01L 29/76* (2006.01)
*H01L 31/068* (2006.01)
*H01L 31/119* (2006.01)
*H01L 31/113* (2006.01)

(52) U.S. Cl.
USPC ........... 257/328; 257/324; 257/330; 257/390; 257/E21.423; 438/128; 438/257; 438/264; 438/270

(58) Field of Classification Search
None
See application file for complete search history.

(56) References Cited

U.S. PATENT DOCUMENTS

| | | |
|---|---|---|
| 6,406,962 B1 | 6/2002 | Agnello et al. |
| 6,544,824 B1 | 4/2003 | Pradeep et al. |
| 6,638,823 B2 | 10/2003 | Cho et al. |
| 7,241,654 B2 | 7/2007 | Forbes |
| 7,368,347 B2 | 5/2008 | Joshi et al. |
| 7,378,707 B2 | 5/2008 | Bhattacharyya |

(Continued)

FOREIGN PATENT DOCUMENTS

| | | |
|---|---|---|
| JP | 2007180389 | 7/2007 |
| KR | 1020060089547 | 8/2006 |

(Continued)

OTHER PUBLICATIONS

Office Action dated Jul. 31, 2012.

(Continued)

*Primary Examiner* — Zandra Smith
*Assistant Examiner* — Khanh Duong
(74) *Attorney, Agent, or Firm* — Onello & Mello, LLP

(57) ABSTRACT

In a semiconductor device, and a method of manufacturing thereof, the device includes a substrate of single-crystal semiconductor material extending in a horizontal direction and a plurality of interlayer dielectric layers on the substrate. A plurality of gate patterns are provided, each gate pattern being between a neighboring lower interlayer dielectric layer and a neighboring upper interlayer dielectric layer. A vertical channel of single-crystal semiconductor material extends in a vertical direction through the plurality of interlayer dielectric layers and the plurality of gate patterns, a gate insulating layer being between each gate pattern and the vertical channel that insulates the gate pattern from the vertical channel.

20 Claims, 29 Drawing Sheets

U.S. PATENT DOCUMENTS

| | | |
|---|---|---|
| 7,382,018 B2 | 6/2008 | Kim et al. |
| 7,631,150 B2 | 12/2009 | Pong |
| 7,662,720 B2 | 2/2010 | Kim et al. |
| 7,679,133 B2 | 3/2010 | Son et al. |
| 7,696,559 B2 | 4/2010 | Arai et al. |
| 7,936,004 B2 | 5/2011 | Kito et al. |
| 8,001,333 B2 | 8/2011 | Pong |
| 8,048,741 B2 | 11/2011 | Arai et al. |
| 2002/0140032 A1 | 10/2002 | Cho et al. |
| 2003/0122184 A1 | 7/2003 | Park |
| 2004/0070007 A1 | 4/2004 | Zhang |
| 2004/0238974 A1 | 12/2004 | Baik |
| 2006/0054976 A1 | 3/2006 | Verhoeven |
| 2006/0186446 A1 | 8/2006 | Kim et al. |
| 2006/0186558 A1 | 8/2006 | Baik |
| 2006/0261404 A1 | 11/2006 | Forbes |
| 2007/0034922 A1 | 2/2007 | Bhattacharyya |
| 2007/0122979 A1 | 5/2007 | Oh et al. |
| 2007/0158736 A1 | 7/2007 | Arai et al. |
| 2007/0252201 A1 | 11/2007 | Kito et al. |
| 2008/0082758 A1 | 4/2008 | Pong |
| 2008/0087940 A1 | 4/2008 | Chae et al. |
| 2008/0179664 A1 | 7/2008 | Rao |
| 2008/0242025 A1 | 10/2008 | Kim et al. |
| 2009/0026541 A1 | 1/2009 | Chung |
| 2009/0121271 A1 | 5/2009 | Son et al. |
| 2010/0070718 A1 | 3/2010 | Pong |
| 2010/0112769 A1 | 5/2010 | Son et al. |
| 2010/0159657 A1 | 6/2010 | Arai et al. |
| 2011/0284947 A1 | 11/2011 | Kito et al. |
| 2011/0287597 A1 | 11/2011 | Kito et al. |

FOREIGN PATENT DOCUMENTS

| | | |
|---|---|---|
| KR | 100674952 | 1/2007 |
| KR | 1020030059376 | 7/2007 |
| KR | 10-2007-0096972 | 10/2007 |
| KR | 1020080030496 | 4/2008 |

OTHER PUBLICATIONS

Office Action dated Jul. 13, 2011, issued in related Chinese Application No. 200810154762.1.

H. Tanaka, et al.,"Bit Cost Scalable Technology with Punch and Plug Process for Ultra High Density Flash Memory", Center for Semiconductor Research & Development and Process & Manufacturing Engineering Center, 2007 Symposium on VLSI Technology Digest of Technical Papers, Jun. 12, 2007, Toshiba Corporation, Semiconductor Company.

Son, Yong-Hoon, et al., "Laser-induced Epitaxial Growth (LEG) Technology for High Density 3-D Stacked Memory with High Productivity", Process Development Team, Memory Division, Samsung Electronics, Co., Ltd., 2007 Symposium on VLSI Technology Digest of Technical Papers, Jun. 14, 2007.

"New Three Dimensional Cell Array Increases Density with Existing Process Technology", Toshiba Develops New NAND Flash Technology, Toshiba: Press Releases Jun. 12, 2007.

"Vertical-Type Non-Volatile Memory Devices" Specification, Drawings, Claims and Prosecution History of U.S. Appl. No. 12/290,742, filed Nov. 3, 2008, by Yong-Hoon Son, et al.

"Vertical-Type Non-Volatile Memory Devices and Method of Manufacturing the Same" Specification, Drawings, Claims and Prosecution History of U.S. Appl. No. 12/686,0652, filed Jan. 12, 2010, by Yong-Hoon Son, et al.

Notice of Allowance dated Jan. 16, 2013.

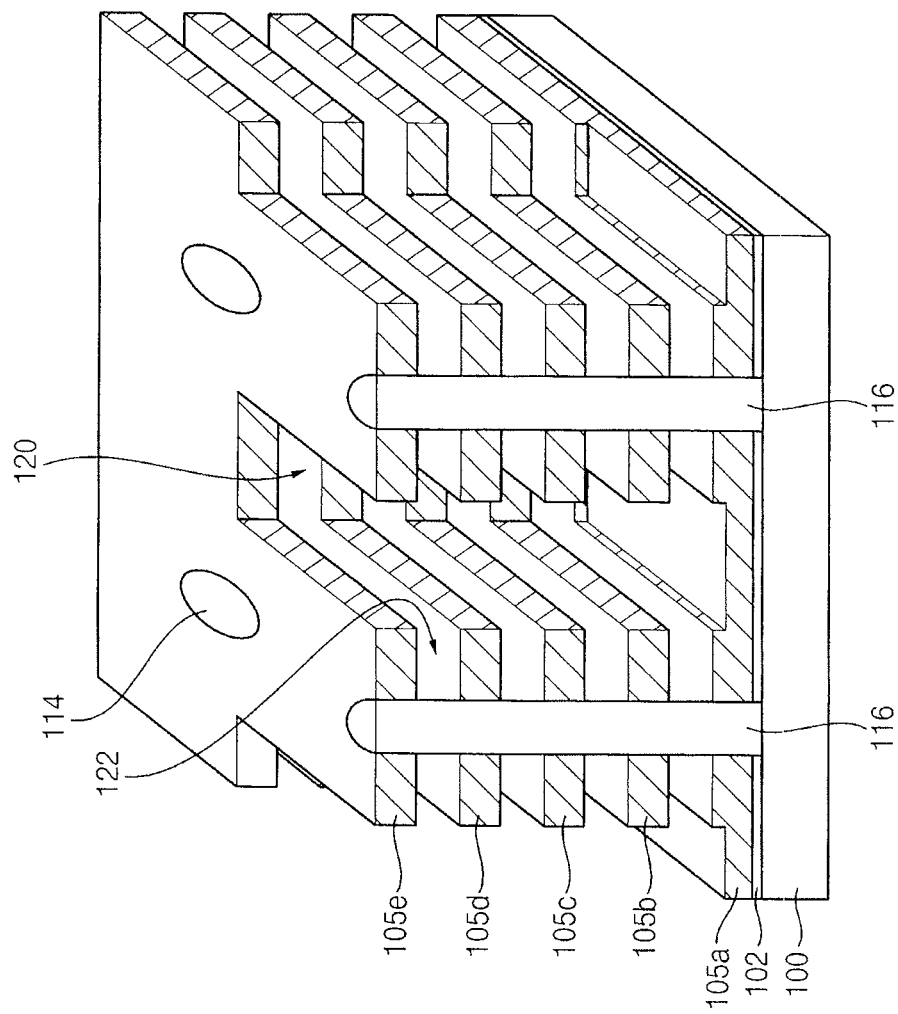

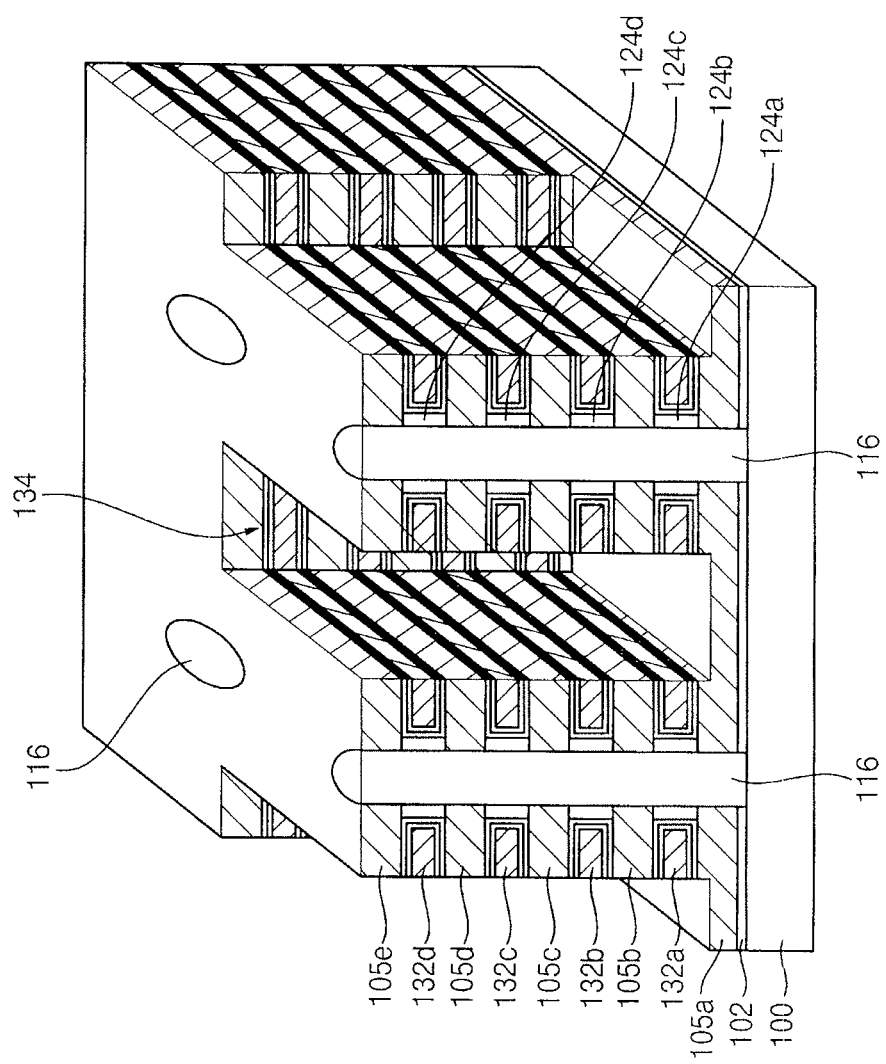

VERTICAL-TYPE NON-VOLATILE MEMORY DEVICES

RELATED APPLICATIONS

This application is a continuation application of U.S. application Ser. No. 12/686,065, which is a continuation application of U.S. application Ser. No. 12/290,742, filed on Nov. 3, 2008, which relies for priority upon Korean Patent Application No. 10-2007-0113535, filed on Nov. 8, 2007, the contents of each being incorporated herein by reference in their entirety.

BACKGROUND OF THE INVENTION

With the continued emphasis on highly integrated electronic devices, there is an ongoing need for semiconductor memory devices that operate at higher speeds and lower power and have increased device density. To accomplish this, devices with aggressive scaling and multiple-layered devices with transistor cells arranged in horizontal and vertical arrays have been under development.

In one approach, planar memory cells, for example NAND memory cells, are formed in a conventional horizontal array. Multiple horizontal arrays are then stacked in a vertical direction. Limitations associated with this approach include poor reliability in the resulting device, since critical lithography steps are required for each layer in achieving the minimum feature size. In addition, in this configuration, the size of the driver transistors for driving the control gates is a function of the number of layers; therefore, the driver transistors are scaled as a multiple of the number of layers. This can lead to integration issues and heat removal concerns.

In another approach, multiple-layered memory devices with vertically oriented channels have been under development. In one configuration, a plurality of gate layers are formed on a substrate, and a vertical channel penetrates the plurality of gate layers. In each vertical channel, a lower gate layer is configured to operate as a lower select gate, a plurality of middle gate layers are configured to operate as control gates, and an upper gate layer is configured to operate as an upper select gate. Upper select gates neighboring each other in a first horizontal direction are connected to operate as row selection lines for the device. Vertical channels neighboring each other are connected in a second horizontal direction to operate as bit lines for the device.

Others attempting the vertically oriented channel approach have met with limited success. In one configuration, vertical edge surfaces of the lower and upper select gates are isolated from the vertical channel using a conventional oxide layer, while vertical edge surfaces of the control gates of the middle gate layers are isolated from the vertical channel using an ONO-type charge trapping layer, in an attempt to form floating-gate type non-volatile memory devices. However, a floating gate is difficult to achieve under this approach.

In addition, others have attempted the vertically oriented channel approach using a poly-silicon vertical channel region. Grain boundaries in a poly-silicon vertical channel lead are associated with crystalline defects, which can increase resistance and form trap sites in the resulting structure. This can lead to increased resistance in the resulting device, which can decrease device speed and increase device power consumption.

Also, others attempting the vertically oriented channel approach have formed the tunnel oxide layer of the ONO charge-trapping layer using a CVD-formed tunnel oxide. Tunnel oxide formed in this manner can quickly degrade over time, leading to poor device reliability and poor device endurance.

SUMMARY OF THE INVENTION

Embodiments of the present invention are directed to vertical-type semiconductor memory devices and methods of forming the same. In particular, in some embodiments, a single-crystal vertical channel is employed. This reduces the likelihood of crystalline defects, and mitigates the number of trap sites, leading to reduced device resistance, and therefore increased speed and decreased power consumption. In addition, in some embodiments, the charge trapping layer is formed to surround the control gate in the region of the vertical channel, leading to simpler and more reliable device formation. Further, in other embodiments, the tunnel oxide positioned between the charge trapping layer and the vertical channel is formed of a thermal oxide layer, which is more resistant to degradation over time, leading to improved device reliability and endurance. This also provides designers with greater flexibility in achieving desired device characteristics.

In one aspect, a semiconductor device comprises: a substrate of single-crystal semiconductor material extending in a horizontal direction; a plurality of interlayer dielectric layers on the substrate; a plurality of gate patterns, each gate pattern between a neighboring lower interlayer dielectric layer and a neighboring upper interlayer dielectric layer; and a vertical channel of single-crystal semiconductor material extending in a vertical direction through the plurality of interlayer dielectric layers and the plurality of gate patterns, a gate insulating layer between each gate pattern and the vertical channel that insulates the gate pattern from the vertical channel.

In one embodiment, the semiconductor device further comprises a charge trapping layer between each corresponding gate pattern and gate insulating layer, the charge trapping layer including: a first portion extending in the vertical direction between the gate pattern and the gate insulating layer; a second portion extending in the horizontal direction between the gate pattern and the neighboring upper interlayer dielectric layer; and a third portion extending in the horizontal direction between the gate pattern and the neighboring lower interlayer dielectric layer.

In another embodiment, the charge trapping layer comprises a floating gate comprising a conducting or a semi-conducting material.

In another embodiment, the gate insulating layer comprises a thermal oxide layer.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device; memory cell transistors of a common string of the semiconductor device are coupled together in series by the vertical channel; upper portions of vertical channels arranged in a second horizontal direction of the semiconductor device are connected to provide bit lines of the semiconductor device; and the semiconductor device comprises a semiconductor memory device.

In another embodiment, the plurality of interlayer dielectric layers each comprise a multiple-layered structure comprising a lower insulating layer, an intermediate insulating layer and an upper insulating layer, the lower and upper insulating layers comprising a material that has etch selectivity relative to the intermediate insulating layer.

In another aspect, a semiconductor device comprises: a substrate extending in a horizontal direction; a plurality of interlayer dielectric layers on the substrate; a plurality of gate patterns, each gate pattern between a neighboring lower interlayer dielectric layer and a neighboring upper interlayer dielectric layer; and a vertical channel extending in a vertical direction through the plurality of interlayer dielectric layers and the plurality of gate patterns, a gate insulating layer between each gate pattern and the vertical channel that insulates the gate pattern from the vertical channel, and a charge trapping layer between each corresponding gate pattern and gate insulating layer, the charge trapping layer including: a first portion extending in the vertical direction between the gate pattern and the gate insulating layer; a second portion extending in the horizontal direction between the gate pattern and the neighboring upper interlayer dielectric layer; and a third portion extending in the horizontal direction between the gate pattern and the neighboring lower interlayer dielectric layer.

In one embodiment, the substrate and the vertical channel comprise single-crystal semiconductor material.

In another embodiment, the charge trapping layer comprises a floating gate comprising a conducting or a semiconducting material.

In another embodiment, the gate insulating layer comprises a thermal oxide layer.

In another embodiment, an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device; memory cell transistors of a common string of the semiconductor device are coupled together in series by the vertical channel; upper portions of vertical channels arranged in a second horizontal direction of the semiconductor device are connected to provide bit lines of the semiconductor device; and the semiconductor device comprises a non-volatile semiconductor memory device.

In another embodiment, the plurality of interlayer dielectric layers each comprise a multiple-layered structure comprising a lower insulating layer, an intermediate insulating layer and an upper insulating layer, the lower and upper insulating layers comprising a material that has etch selectivity relative to the intermediate insulating layer.

In another aspect, a semiconductor device comprises: a substrate extending in a horizontal direction; a plurality of interlayer dielectric layers on the substrate; a plurality of gate patterns, each gate pattern between a neighboring lower interlayer dielectric layer and a neighboring upper interlayer dielectric layer; and a vertical channel extending in a vertical direction through the plurality of interlayer dielectric layers and the plurality of gate patterns, a gate insulating layer comprising a thermal oxide layer between each gate pattern and the vertical channel that insulates the gate pattern from the vertical channel.

In one embodiment, the substrate and the vertical channel comprise single-crystal semiconductor material.

In another embodiment, the device further comprises a charge trapping layer between each corresponding gate pattern and gate insulating layer, the charge trapping layer including: a first portion extending in the vertical direction between the gate pattern and the gate insulating layer; a second portion extending in the horizontal direction between the gate pattern and the neighboring upper interlayer dielectric layer; and a third portion extending in the horizontal direction between the gate pattern and the neighboring lower interlayer dielectric layer.

In another embodiment, the charge trapping layer comprises a floating gate comprising a conducting or a semiconducting material.

In another embodiment, an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device; memory cell transistors of a common string of the semiconductor device are coupled together in series by the vertical channel; upper portions of vertical channels arranged in a second horizontal direction of the semiconductor device are connected to provide bit lines of the semiconductor device; and the semiconductor device comprises a semiconductor memory device.

In another embodiment, the plurality of interlayer dielectric layers each comprise a multiple-layered structure comprising a lower insulating layer, an intermediate insulating layer and an upper insulating layer, the lower and upper insulating layers comprising a material that has etch selectivity relative to the intermediate insulating layer.

In another aspect, a method of fabricating a semiconductor device comprises: providing a substrate of single-crystal semiconductor material extending in a horizontal direction; providing a plurality of interlayer dielectric layers on the substrate; providing a plurality of gate patterns, each gate pattern between a neighboring lower interlayer dielectric layer and a neighboring upper interlayer dielectric layer; providing a vertical channel of single-crystal semiconductor material extending in a vertical direction through the plurality of interlayer dielectric layers and the plurality of gate patterns; and providing a gate insulating layer between each gate pattern and the vertical channel that insulates the gate pattern from the vertical channel.

In one embodiment, the method further comprises providing a charge trapping layer between each corresponding gate pattern and gate insulating layer, the charge trapping layer including: a first portion extending in the vertical direction between the gate pattern and the gate insulating layer; a second portion extending in the horizontal direction between the gate pattern and the neighboring upper interlayer dielectric layer; and a third portion extending in the horizontal direction between the gate pattern and the neighboring lower interlayer dielectric layer.

In another embodiment, the charge trapping layer comprises a floating gate comprising a conducting or a semiconducting material.

In another embodiment, providing the gate insulating layer comprises a providing a thermal oxide layer.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device, and further comprising: coupling memory cell transistors of a common string of the semiconductor device together in series; and connecting upper portions of vertical channels arranged in a second horizontal direction of the semiconductor device to provide bit lines of the semiconductor device, wherein the semiconductor device comprises a semiconductor memory device.

In another embodiment, providing each of the plurality of interlayer dielectric layers comprises providing a multiple-layered structure comprising a lower insulating layer, an intermediate insulating layer and an upper insulating layer, the lower and upper insulating layers comprising a material that has etch selectivity relative to the intermediate insulating layer.

In another aspect, a method of fabricating a semiconductor device comprises: providing a substrate extending in a horizontal direction; providing a plurality of interlayer dielectric layers on the substrate; providing a plurality of gate patterns, each gate pattern between a neighboring lower interlayer dielectric layer and a neighboring upper interlayer dielectric layer; providing a vertical channel extending in a vertical direction through the plurality of interlayer dielectric layers and the plurality of gate patterns; providing a gate insulating layer between each gate pattern and the vertical channel that insulates the gate pattern from the vertical channel; and providing a charge trapping layer between each corresponding gate pattern and gate insulating layer, the charge trapping layer including: a first portion extending in the vertical direction between the gate pattern and the gate insulating layer; a second portion extending in the horizontal direction between the gate pattern and the neighboring upper interlayer dielectric layer; and a third portion extending in the horizontal direction between the gate pattern and the neighboring lower interlayer dielectric layer.

In one embodiment, providing the substrate comprises providing a substrate comprising single-crystal semiconductor material, wherein providing the vertical channel comprises providing a vertical channel comprising single-crystal semiconductor material.

In another embodiment, the charge trapping layer comprises a floating gate comprising a conducting or a semi-conducting material.

In another embodiment, providing the gate insulating layer comprises a providing a thermal oxide layer.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device, and further comprising: coupling memory cell transistors of a common string of the semiconductor device together in series; and connecting upper portions of vertical channels arranged in a second horizontal direction of the semiconductor device to provide bit lines of the semiconductor device, wherein the semiconductor device comprises a non-volatile semiconductor memory device.

In another embodiment, providing each of the plurality of interlayer dielectric layers comprises providing a multiple-layered structure comprising a lower insulating layer, an intermediate insulating layer and an upper insulating layer, the lower and upper insulating layers comprising a material that has etch selectivity relative to the intermediate insulating layer.

In another aspect, a method of fabricating a semiconductor device comprises: providing a substrate extending in a horizontal direction; providing a plurality of interlayer dielectric layers on the substrate; providing a plurality of gate patterns, each gate pattern between a neighboring lower interlayer dielectric layer and a neighboring upper interlayer dielectric layer; providing a vertical channel extending in a vertical direction through the plurality of interlayer dielectric layers and the plurality of gate patterns; and providing a gate insulating layer comprising a thermal oxide layer between each gate pattern and the vertical channel that insulates the gate pattern from the vertical channel.

In one embodiment, providing the substrate comprises providing a substrate comprising single-crystal semiconductor material, and providing the vertical channel comprises providing a vertical channel comprising single-crystal semiconductor material.

In another embodiment, the method further comprises providing a charge trapping layer between each corresponding gate pattern and gate insulating layer, the charge trapping layer including: a first portion extending in the vertical direction between the gate pattern and the gate insulating layer; a second portion extending in the horizontal direction between the gate pattern and the neighboring upper interlayer dielectric layer; and a third portion extending in the horizontal direction between the gate pattern and the neighboring lower interlayer dielectric layer.

In another embodiment, the charge trapping layer comprises a floating gate comprising a conducting or a semi-conducting material.

In another embodiment: an upper-most gate pattern of the plurality of gate patterns comprises an upper select gate of an upper select transistor; a lower-most gate pattern of the plurality of gate patterns comprises a lower select gate of a lower select transistor; remaining gate patterns of the plurality of gate patterns between the upper select gate and the lower select gate comprise control gates of memory cell transistors of a common string of the semiconductor device; control gates of memory cell transistors sharing a same layer of the device arranged in a first horizontal direction of the semiconductor device are connected to provide word lines of the semiconductor device, and further comprising: coupling memory cell transistors of a common string of the semiconductor device together in series; and connecting upper portions of vertical channels arranged in a second horizontal direction of the semiconductor device to provide bit lines of the semiconductor device, wherein the semiconductor device comprises a semiconductor memory device.

In another embodiment, providing each of the plurality of interlayer dielectric layers comprises providing a multiple-layered structure comprising a lower insulating layer, an intermediate insulating layer and an upper insulating layer, the lower and upper insulating layers comprising a material that has etch selectivity relative to the intermediate insulating layer.

BRIEF DESCRIPTION OF THE DRAWINGS

The foregoing and other objects, features and advantages of the embodiments of the invention will be apparent from the more particular description of preferred embodiments of the invention, as illustrated in the accompanying drawings in which like reference characters refer to the same parts throughout the different views. The drawings are not necessarily to scale, emphasis instead being placed upon illustrating the principles of the invention. In the drawings.

DETAILED DESCRIPTION OF EMBODIMENTS

Embodiments of the present invention will now be described more fully hereinafter with reference to the accompanying drawings, in which preferred embodiments of the invention are shown. This invention may, however, be embodied in different forms and should not be construed as limited to the embodiments set forth herein. Like numbers refer to like elements throughout the specification.

It will be understood that, although the terms first, second, etc. are used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "on" or "connected" or "coupled" to another element, it can be directly on or connected or coupled to the other element or intervening elements can be present. In contrast, when an element is referred to as being "directly on" or "directly connected" or "directly coupled" to another element, there are no intervening elements present. Other words used to describe the relationship between elements should be interpreted in a like fashion (e.g., "between" versus "directly between," "adjacent" versus "directly adjacent," etc.). When an element is referred to herein as being "over" another element, it can be over or under the other element, and either directly coupled to the other element, or intervening elements may be present, or the elements may be spaced apart by a void or gap.

The terminology used herein is for the purpose of describing particular embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Figure 1:
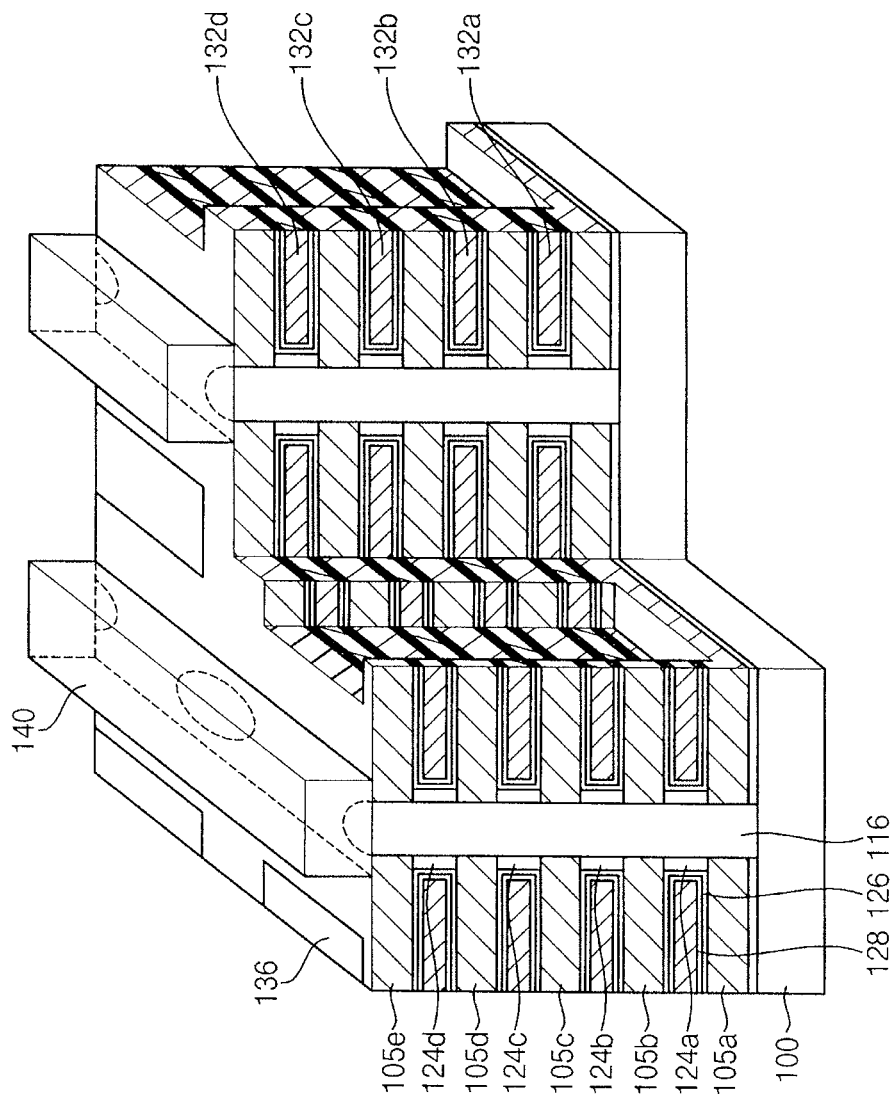
FIG. 1 is a cross-sectional perspective view of vertical-channel memory device, in accordance with an embodiment of the present invention.
Figure 2:
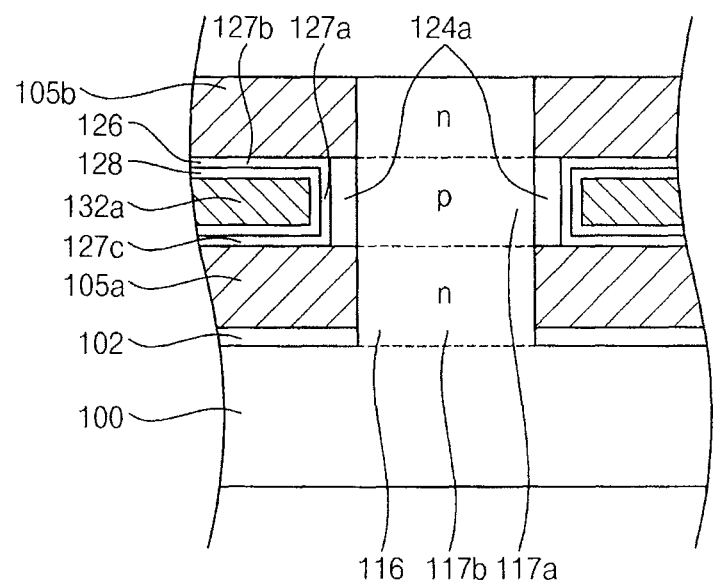
FIG. 2 is a close-up view of a channel region of one of the devices of the vertical-channel memory device, in accordance with an embodiment of the present invention.

FIG. 1 is a cross-sectional perspective view of vertical-channel memory device, in accordance with an embodiment of the present invention. FIG. 2 is a close-up view of a channel region of one of the devices of the vertical-channel memory device, in accordance with an embodiment of the present invention.

Referring to FIG. 1, in this example, a substrate 100 of single-crystal semiconductor material is provided. In various embodiments, the substrate can comprise bulk single-crystal material, a single-crystal SOI configuration, or other suitable substrate configuration. The substrate 100 extends in a horizontal direction. An optional pad oxidation layer 102 is on the substrate 100. A plurality of interlayer dielectric layers 105a, 105b, 105c, 105d, . . . are provided on the pad oxidation layer 102. A plurality of gate patterns 132a, 132b, 132c, 132d are provided, each gate pattern being between a neighboring lower interlayer dielectric layer 105a, 105b, 105c, 105d, . . . and a neighboring upper interlayer dielectric layer 105a, 105b, 105c, 105d, . . . For example, gate pattern 132a is between neighboring lower interlayer dielectric layer 105a and neighboring upper interlayer dielectric layer 105b, gate pattern 132b is between neighboring lower interlayer dielectric layer 105b and neighboring upper interlayer dielectric layer 105c, gate pattern 132c is between neighboring lower interlayer dielectric layer 105c and neighboring upper interlayer dielectric layer 105d, etc.

A vertical channel 116 of single-crystal semiconductor material extends in a vertical direction through the plurality of interlayer dielectric layers 105a, 105b, 105c, 105d, . . . and the plurality of gate patterns 132a, 132b, 132c, 132d, . . . The vertical channel 116 is surrounded by each of the gate patterns 132a, 132b, 132c, 132d, . . . For example, gate pattern 132a surrounds, or encompasses, the perimeter of the lower-most portion of the walls of the vertical channel 116. The same holds true for the other gate patterns 132b, 132c, 132d, . . . A gate insulating layer 124a, 124b, 124c, 124d, . . . is provided between each gate pattern 132a, 132b, 132c, 132d, . . . and the vertical channel 116. The gate insulating layer insulates the gate pattern 132a, 132b, 132c, 132d, . . . from the vertical channel 116. In one embodiment, the gate insulating layer 124a, 124b, 124c, 124d, . . . comprises a thermal oxide layer.

In an example where the vertical-channel memory device comprises a non-volatile memory device, a charge trapping layer 126 is provided between each corresponding gate pattern 132a, 132b, 132c, 132d, . . . and gate insulating layer 124a, 124b, 124c, 124d, . . . Referring to FIG. 2, in one embodiment, the charge trapping layer includes: a first portion 127a extending in the vertical direction between the gate pattern 132a and the gate insulating layer 124a; a second portion 127b extending in the horizontal direction between the gate pattern 132a and the neighboring upper interlayer dielectric layer 105b; and a third portion 127c extending in the horizontal direction between the gate pattern 132a and the neighboring lower interlayer dielectric layer 105a. A blocking layer 128 formed of insulative material is between the charge trapping layer 126 and the gate pattern 132a, 132b, 132c, 132d, . . .

In various embodiments, the charge trapping layer 126 is in the form of a floating gate comprising a conducting or a semiconducting material. Alternatively, the charge trapping layer 126 can comprise an ONO, nitride, polysilicon, or quantum-dot structures.

In an embodiment, in a semiconductor memory device configured in accordance with embodiments of the present invention, an upper-most gate pattern, for example gate pattern 132d, of the plurality of gate patterns comprises an upper select gate of an upper select transistor; and a lower-most gate pattern, for example gate pattern 132a, of the plurality of gate patterns comprises a lower select gate of a lower select transistor. Remaining gate patterns, for example gate patterns 132b, 132c, of the plurality of gate patterns between the upper select gate 132d and the lower select gate 132a, comprise control gates of memory cell transistors of a common string of the semiconductor device. Control gates of memory cell transistors sharing a same layer of the device arranged in a first horizontal direction of the semiconductor device are connected to provide word lines of the semiconductor device. Memory cell transistors of a common string of the semiconductor device are coupled together in series by the vertical channel 116. Upper portions of vertical channels 116 arranged in a second horizontal direction of the semiconductor device are connected, for example by lines 140 to provide bit lines of the semiconductor device. Although this example illustrates only two memory cell transistors in each vertical channel for purposes of clear illustration of the embodiments of the present invention, embodiments of the present invention are not thus limited, and can include as few as one memory cell transistor in each vertical channel, and as many memory cell transistors in vertical channel as desired for the application, for example, two, four, eight, sixteen, or thirty-two transistors.

In some embodiments, as will be described below in connection with FIG. 4 and FIGS. 5A-5L the plurality of interlayer dielectric layers each comprise a multiple-layered structure 205 comprising a lower insulating layer 205a, an intermediate insulating layer 205b and an upper insulating layer 205c, the lower and upper insulating layers 205a, 205c comprising a material that has etch selectivity relative to the intermediate insulating layer 205b.

Figure 3A:
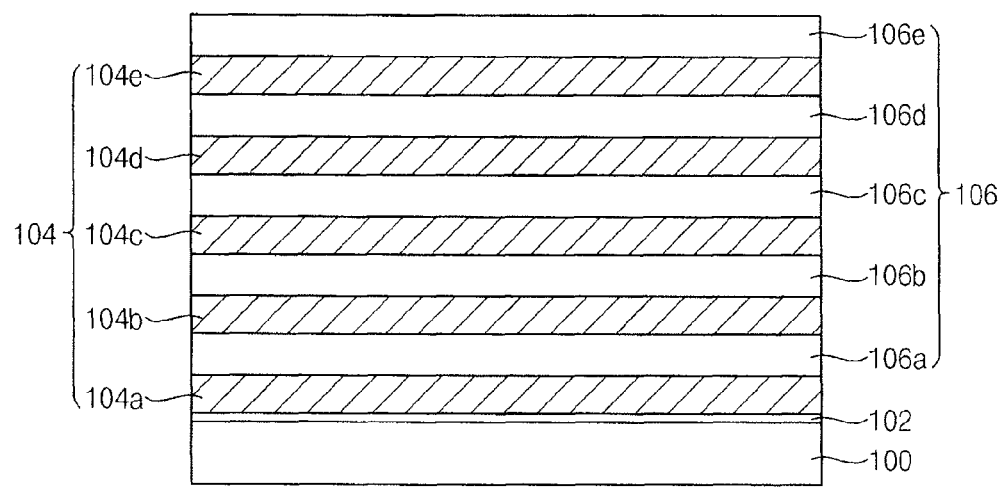
FIGS. 3A-3P are cross-sectional views of a method of forming a vertical-channel memory device, in accordance with an embodiment of the present invention.
Figure 3B:
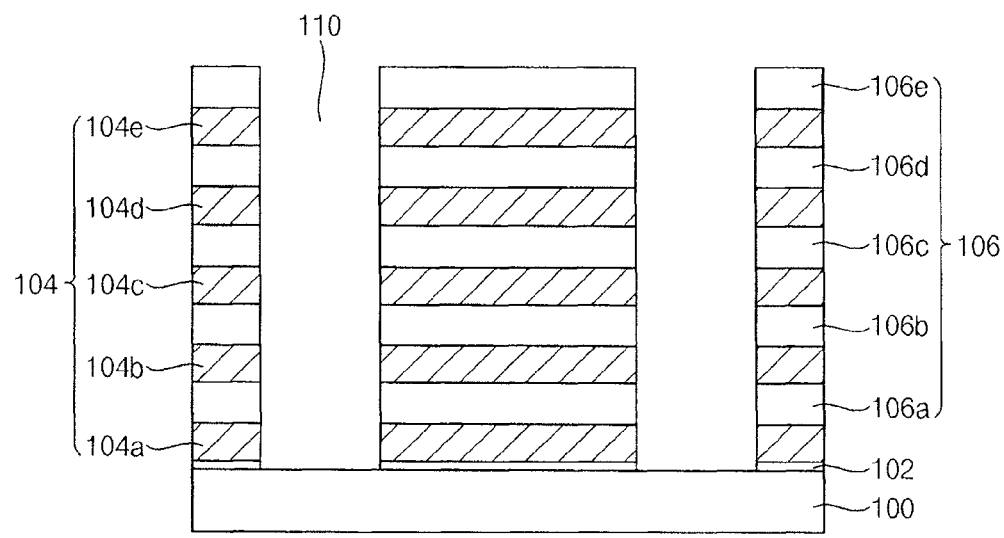
Figure 3C:
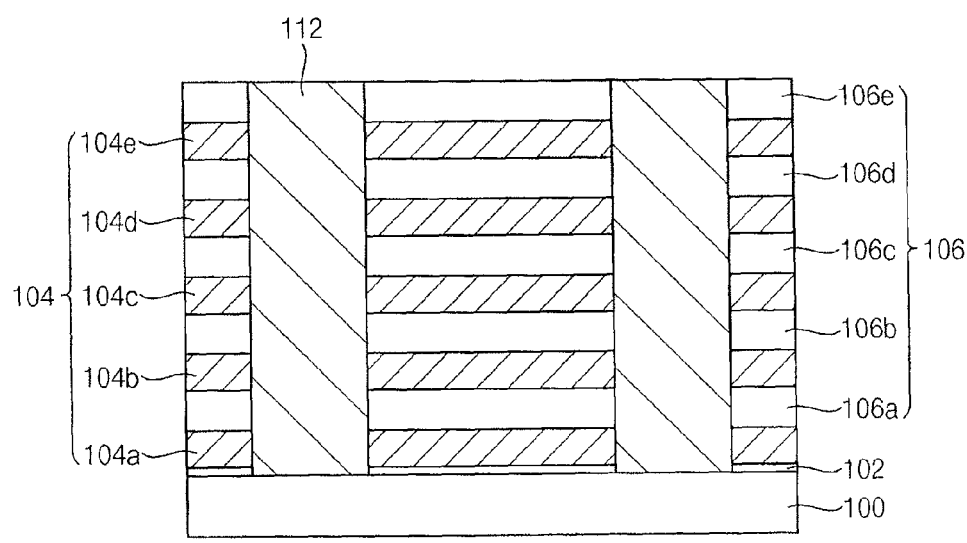
Figure 3D:
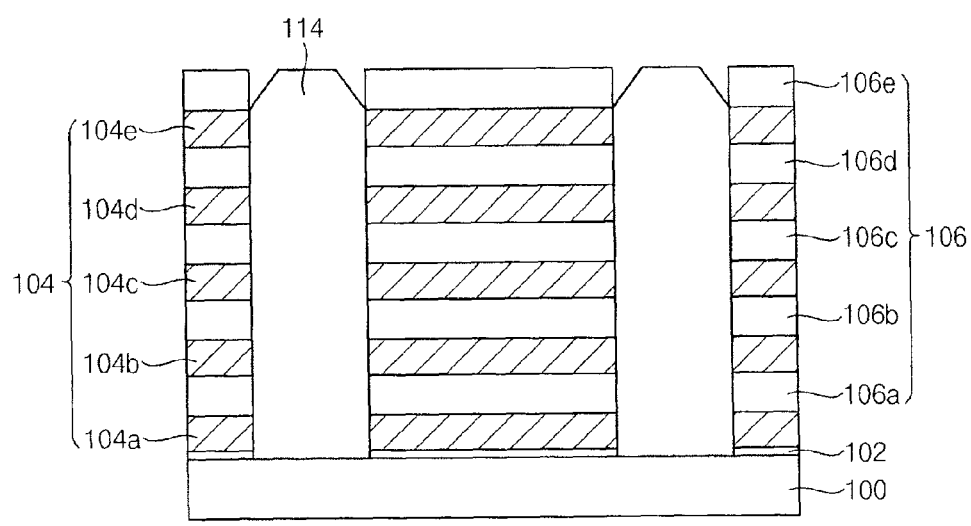
Figure 3E:
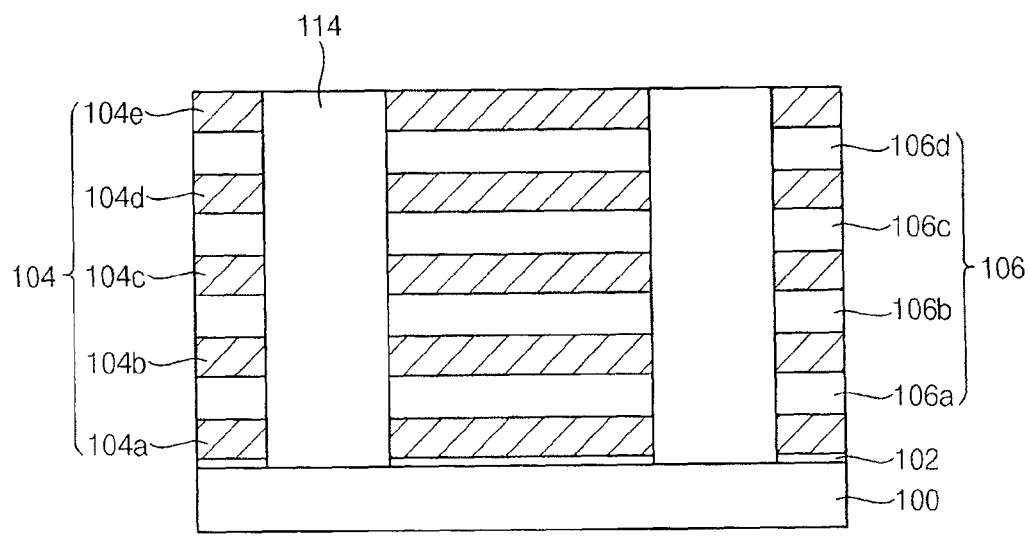
Figure 3F:
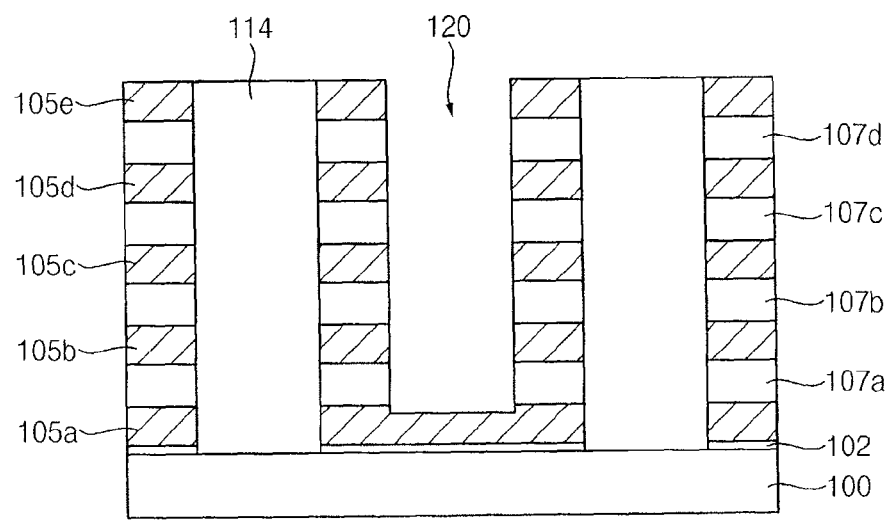
Figure 3G:
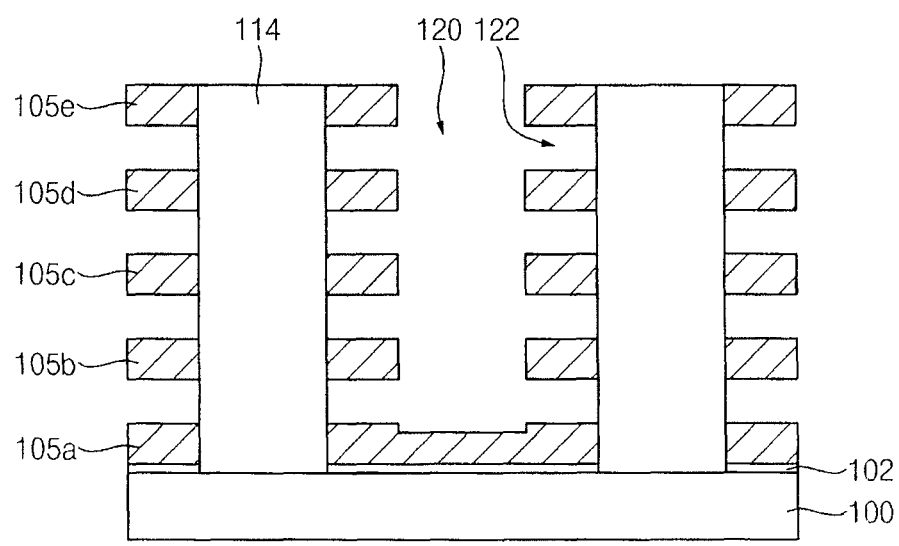
Figure 3I:
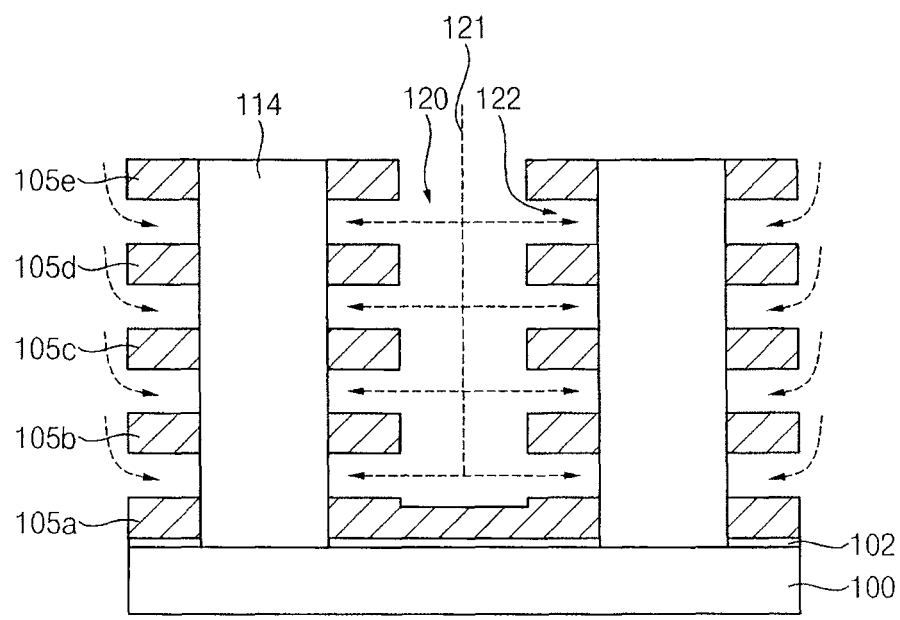
Figure 3J:
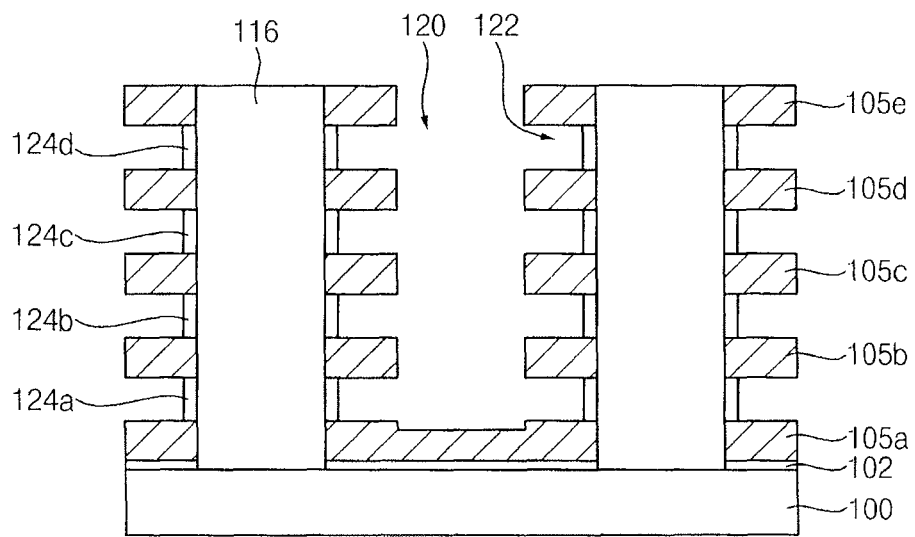
Figure 3K:
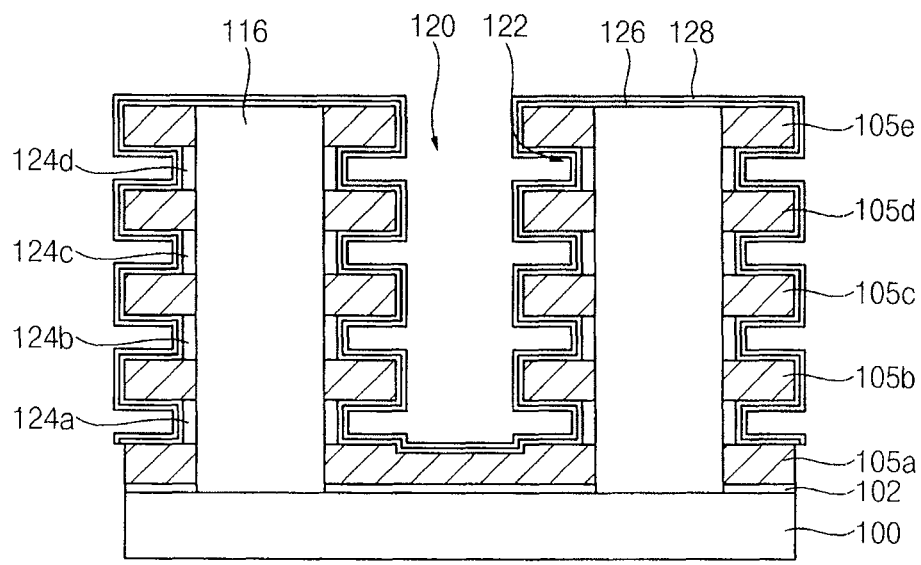
Figure 3L:
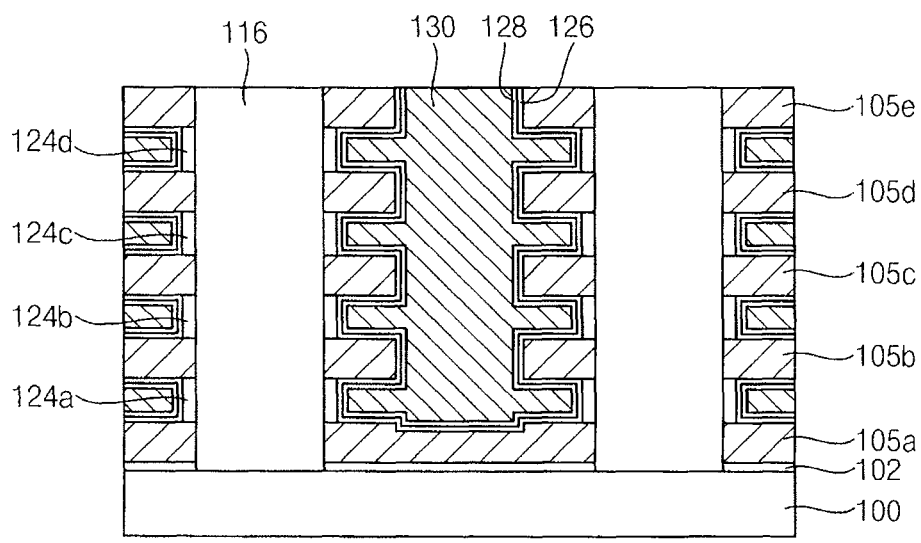
Figure 3M:
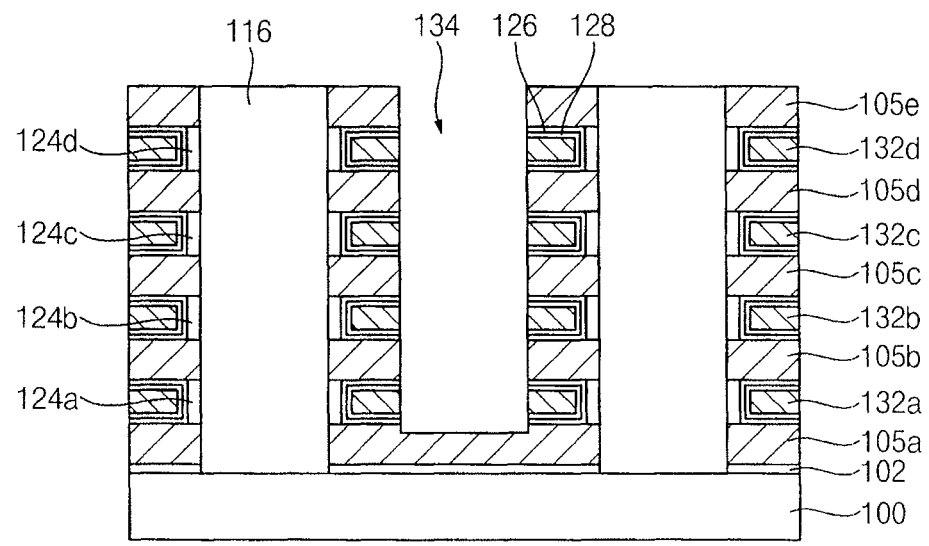
Figure 3O:
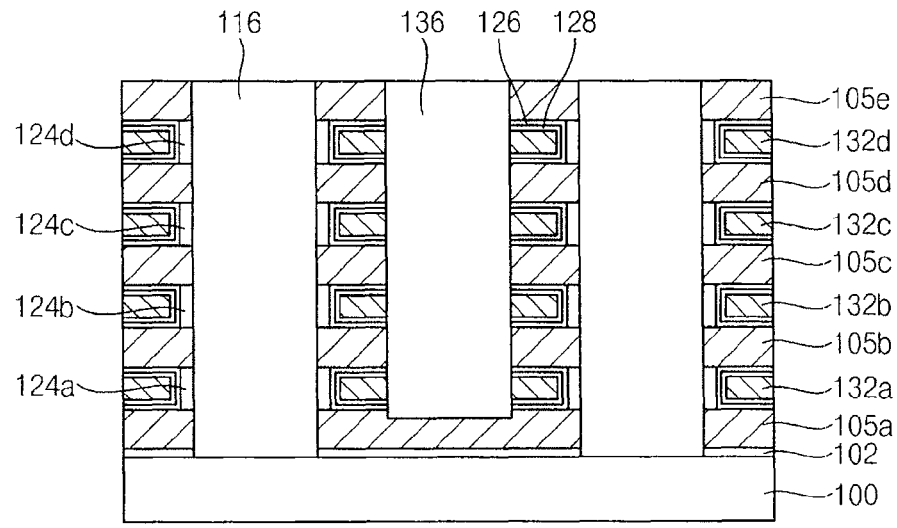
Figure 3P:
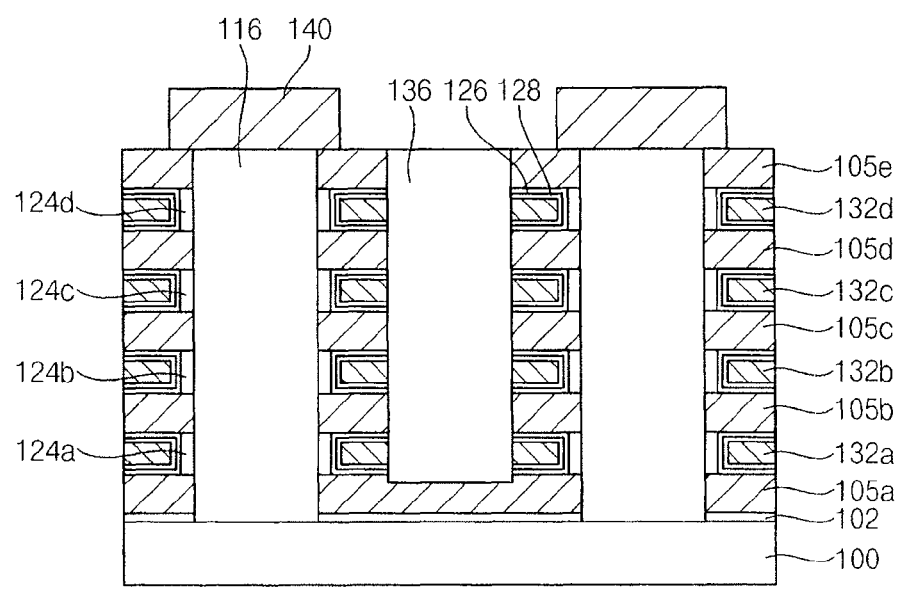

FIGS. 3A-3P are cross-sectional views of a method of forming a vertical-channel memory device, in accordance with an embodiment of the present invention.

Referring to FIG. 3A, a substrate 100 is prepared. In one embodiment, the substrate 100 comprises a single-crystal semiconductor material substrate that provides a seed layer for later formation of the single-crystal vertical channels 116. An optional pad oxide layer 102 is provided on the upper surface of the substrate 100. Multiple alternating interlayer dielectric layers 104a, 104b, 104c, 104d, 104e, . . . and sacrificial layers 106a, 106b, 106c, 106d, 106e, . . . are formed on the pad oxide layer 102. In one embodiment, the interlayer dielectric layers 104 and the sacrificial layers 106 have etch selectivity with respect to each other. For example, the interlayer dielectric layers 104 can comprise silicon nitride and the sacrificial layers 106 can comprise silicon oxide. Alternatively, the interlayer dielectric layers 104 can comprise silicon oxide and the sacrificial layers 106 can comprise silicon nitride. In one embodiment, the sacrificial layers 106 are formed of a material that can readily be removed by a wet etching process.

Referring to FIG. 3B, first openings 110 are formed through the interlayer dielectric layers 104, the sacrificial layers 106, and the pad oxide layer 102 in a vertical direction, and spaced apart in a horizontal direction, as shown. The first openings 110 expose upper portions of the underlying substrate 100.

Referring to FIG. 3C, a first poly-silicon layer 112 or first amorphous silicon layer 112 is formed in the first openings 110, in contact with the exposed upper portions of the substrate 100. In one embodiment, the first poly-silicon layer 112 or first amorphous silicon layer 112 can be formed by a chemical-vapor deposition (CVD) process; however, other suitable processes for forming the first poly-silicon layer 112 or first amorphous silicon layer 112 may be applied. In one embodiment, the first poly-silicon layer 112 or first amorphous silicon layer 112 can be doped with impurities at this stage, for example, doped with n-type impurities.

Referring to FIG. 3D, a heat treatment is applied to the first poly-silicon layer 112 or first amorphous silicon layer 112 to convert the layer to a single-crystal silicon pattern 114, that has the same crystal orientation as that of the underlying substrate 100. In one example embodiment, the heat-treatment can take the form of a laser-induced epitaxial growth (LEG) process to obtain the single-crystal silicon pattern 114, as is known in the art.

Figure 9:
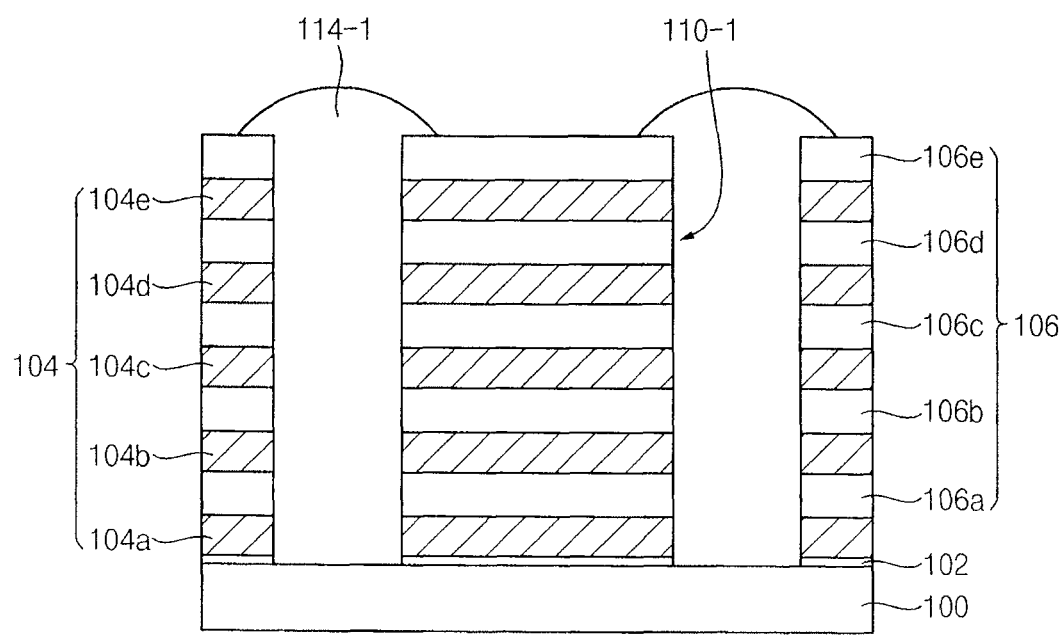
FIG. 9 is a cross-sectional view of a method of forming a vertical-channel memory device, where the vertical channels are formed of a single-crystal semiconductor material formed using selective epitaxial growth (SEG), in accordance with an embodiment of the present invention.

Referring to FIG. 9, in an alternative embodiment, single-crystal silicon patterns 114-1 can be grown in the openings 110-1 of FIG. 3B from the upper surface of the substrate 100 using a selective epitaxial growth (SEG) process. The SEG process is performed using the exposed substrate region 100 as a seed layer. The exposed substrate region 100 can comprise a semiconductor material, for example, a single-crystal semiconductor material.

Referring to FIG. 3E, an optional chemical-mechanical polishing (CMP) process can be performed on the uppermost sacrificial layer 106e, to expose the underlying uppermost interlayer dielectric layer 104e. An upper portion of the single-crystal silicon patterns 114 can be removed during this procedure.

Referring to FIG. 3F, a plurality of second openings 120 are formed between neighboring single-crystal silicon patterns 114, to thereby form interlayer dielectric layer patterns 105a, 105b, 105c, 105d, 105e, . . . and sacrificial layer patterns 107a, 107b, 107c, 107d, . . . In one embodiment, the second openings 120 expose the lowermost interlayer dielectric layer pattern 105a. This procedure permits access to a region where the control gates and floating gates of the resulting memory device will be formed along the resulting vertical channels.

Referring to FIG. 3G, the sacrificial layer patterns 107a, 107b, 107c, 107d, . . . are removed by a wet etching process. In an example where the sacrificial layer patterns 107a, 107b, 107c, 107d, . . . are formed of silicon nitride, the etchant of the wet etching process can comprise an HF solution. Resulting concave openings 122 surround the walls of the single-crystal silicon patterns 114, to expose the walls at all sides thereof. FIG. 3H is a perspective view of the resulting structure.

Referring to FIG. 3I, impurity doping 121 can be performed at the exposed sidewalls of the single-crystal silicon patterns 114. For example, injection of p-type impurities can be performed at the exposed sidewalls. A plasma doping (PLAD) process can be used for performing the injection.

Assuming the bodies of the single-crystal silicon patterns 114 are doped above with n-type impurities, as described above in connection with FIG. 3C, the formation of p-type doped regions in the single-crystal silicon patterns 114 at the exposed sidewalls creates p-type channel regions 117a for the resulting vertical channels 116 that are positioned between n-type source/drain regions 117b of the vertical channels 116, as shown in close-up view in FIG. 2. The p-type channel regions 117a are "self-aligned" in the vertical channels 116 as a result of the respective positions of the interlayer dielectric layer patterns 105a, 105b, 105c, 105d, 105e. Although the p-type channel regions 117b are shown in the close-up view of FIG. 2 as extending across the entire body of the vertical channel, in other embodiments, the p-type channel regions 117b only extend slightly into the body of the vertical channel 116, from its surface.

Referring to FIG. 3J, tunnel oxide layers 124a, 124b, 124c, 124d, . . . are formed at the exposed sidewalls of the resulting vertical channels 116. The tunnel oxide layers 124a, 124b, 124c, 124d, . . . surround the vertical channels, for example, in a case where the vertical channels 116 are circular in cross-section, the tunnel oxide layers 124a, 124b, 124c, 124d, . . . are ring-shaped. In one embodiment, the tunnel oxide layers 124a, 124b, 124c, 124d, . . . are formed using a thermal oxidation process. A tunnel oxide layer formed using a thermal oxidation process is more resistant to degradation over time, leading to improved device reliability and endurance.

Referring to FIG. 3K, a charge trapping layer 126 is applied to the resulting structure, coating the walls of the concave openings 122, including the interlayer dielectric layer patterns 105a, 105b, 105c, 105d, 105e, . . . and the tunnel oxide layers 124a, 124b, 124c, 124d, . . . In various embodiments, the charge trapping layer 126 can be a floating-gate structure, for example, comprising a poly-silicon material. In other embodiments, the charge trapping layer 126 can comprise an ONO (oxide-nitride-oxide) structure, a nitride structure, a polysilicon structure, or quantum-dot structures. A floating-gate charge trapping layer 126 is possible in the embodiments of the present invention, since access is gained behind the tunnel oxide layers 124a, 124b, 124c, 124d, . . . at the concave openings 122.

A blocking insulating layer 128 is formed on the resulting structure, covering the charge trapping layer 126. In one example embodiment, the blocking oxide layer 128 comprises silicon oxide, or other suitable high-k oxide layer.

Referring to FIG. 3L, a conductive material is provided to fill the second openings 120, including the concave openings 122, resulting in the formation of conductive patterns 130. In one embodiment, the conductive material comprises tungsten silicide.

Referring to FIG. 3M, the central portions of the conductive patterns 130 are etched, forming third openings 134 that expose the surface of the lowermost interlayer dielectric layer 105a, and expose outer sidewalls of the interlayer dielectric layer patterns 105a, 105b, 105c, 105d, 105e, . . . This separates portions of the conductive patterns 130 that fill the concave openings 122 into gate patterns 132a, 132b, 132c, 132d, . . . , and separates the charge trapping layer into individual charge trapping layer patterns. FIG. 3N is a perspective view of the resulting structure.

Referring to FIG. 3O, the third openings 134 are filled with an insulation pattern 136.

Referring to FIG. 3P, conductive bit lines 140 are formed and patterned to connect neighboring vertical channels 116 in a second horizontal direction of the semiconductor device, as described above in connection with FIG. 1.

Figure 4:
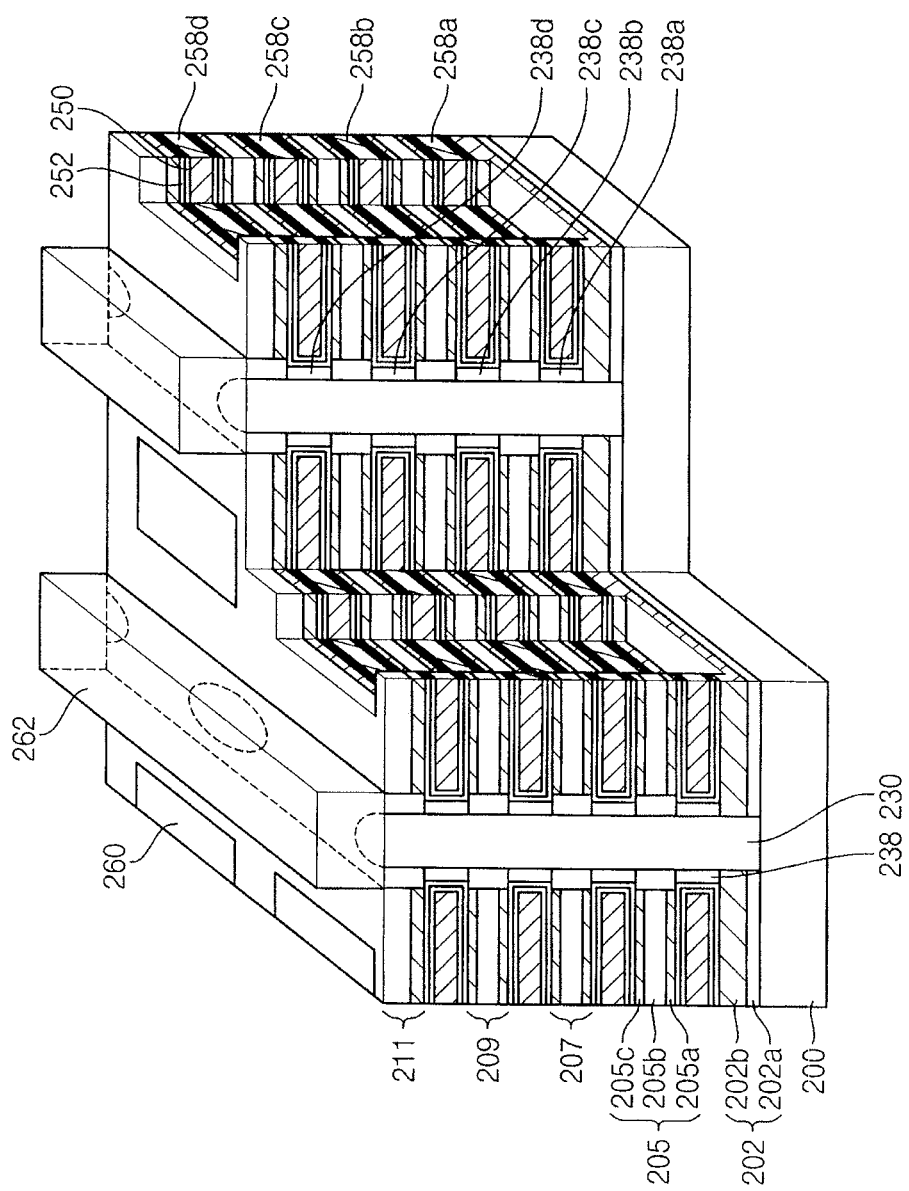
FIG. 4 is cross-sectional perspective view of vertical-channel memory device, in accordance with another embodiment of the present invention.

FIG. 4 is cross-sectional perspective view of vertical-channel memory device, in accordance with another embodiment of the present invention. This embodiment is substantially similar in configuration to the embodiment shown and described above in connection with FIGS. 1, 2, and 3A-3P. A difference, however, lies in that the interlayer dielectric layer patterns 202, 205, 207, 209, 211 of the present embodiment are formed of multiple layers, rather than of a single layer.

Referring to FIG. 4, in this embodiment, a substrate 200 of single-crystal semiconductor material is provided. The substrate 200 extends in a horizontal direction. A plurality of interlayer dielectric layer pattern 202, 205, 207, 209, 211, . . . are provided on the substrate 200. A plurality of gate pattern 258a, 258b, 258c, 258d, . . . are provided, each gate pattern being between a neighboring lower interlayer dielectric layer patterns 202, 205, 207, 209, 211, . . . and a neighboring upper interlayer dielectric layer patterns 202, 205, 207, 209, 211, . . .

A vertical channel 230 of single-crystal semiconductor material extends in a vertical direction through the plurality of interlayer dielectric layer patterns 202, 205, 207, 209, 211, . . . and the plurality of gate patterns 258a, 258b, 258c, 258d, . . . The vertical channel 230 is surrounded by each of the gate patterns 258a, 258b, 258c, 258d, . . . A gate insulating layer 238a, 238b, 238c, 238d, . . . is provided between each gate pattern 258a, 258b, 258c, 258d and the vertical channel 230. The gate insulating layers 238a, 238b, 238c, 238d, . . . insulate the corresponding gate pattern 258a, 258b, 258c, 258d, . . . from the vertical channel 230. In one embodiment, as described above, the gate insulating layers 238a, 238b, 238c, 238d, . . . comprise a thermal oxide layer.

In an example where the vertical-channel memory device comprises a non-volatile memory device, a charge trapping layer 250 is provided between each corresponding gate pattern 258a, 258b, 258c, 258d, . . . and gate insulating layer 238a, 238b, 238c, 238d, . . . As described above in connection with the close-up view of FIG. 2, in one embodiment, the charge trapping layer 250 can include: a first portion 127a extending in the vertical direction between the gate pattern 132a and the gate insulating layer 124a; a second portion 127b extending in the horizontal direction between the gate pattern 132a and the neighboring upper interlayer dielectric layer 105b; and a third portion 127c extending in the horizontal direction between the gate pattern 132a and the neighboring lower interlayer dielectric layer 105a. A blocking layer 252 formed of insulative material is between the charge trapping layer 250 and the gate pattern 258a, 258b, 258c, 258d, . . .

In various embodiments, the charge trapping layer 250 is in the form of a floating gate comprising a conducting or a semiconducting material. Alternatively, the charge trapping layer can comprise an ONO, nitride, polysilicon, or quantum-dot structure In an embodiment, in a semiconductor memory device configured in accordance with embodiments of the present invention, an upper-most gate pattern, for example gate pattern 258d, of the plurality of gate patterns comprises an upper select gate of an upper select transistor; and a lower-most gate pattern, for example gate pattern 258a, of the plurality of gate patterns comprises a lower select gate of a lower select transistor. Remaining gate patterns, for example gate patterns 258b, 258c, of the plurality of gate patterns between the upper select gate 258d and the lower select gate 258a, comprise control gates of memory cell transistors of a common string of the semiconductor device. Control gates of memory cell transistors sharing a same layer of the device arranged in a first horizontal direction of the semiconductor device are connected to provide word lines of the semiconductor device. Memory cell transistors of a common string of the semiconductor device are coupled together in series by the vertical channel 230. Upper portions of vertical channels 230 arranged in a second horizontal direction of the semiconductor device are connected, for example by lines 262 to provide bit lines of the semiconductor device. As described above, although this example illustrates only two memory cell transistors in each vertical channel for purposes of clear illustration of the embodiments of the present invention, embodiments of the present invention are not thus limited, and can include as few as one memory cell transistor in each vertical channel, and as many memory cell transistors in vertical channel as desired for the application, for example, two, four, eight, sixteen, or thirty-two transistors.

FIGS. 5A-5L are cross-sectional views of a method of forming a vertical-channel memory device, in accordance with another embodiment of the present invention.

Figure 5A:
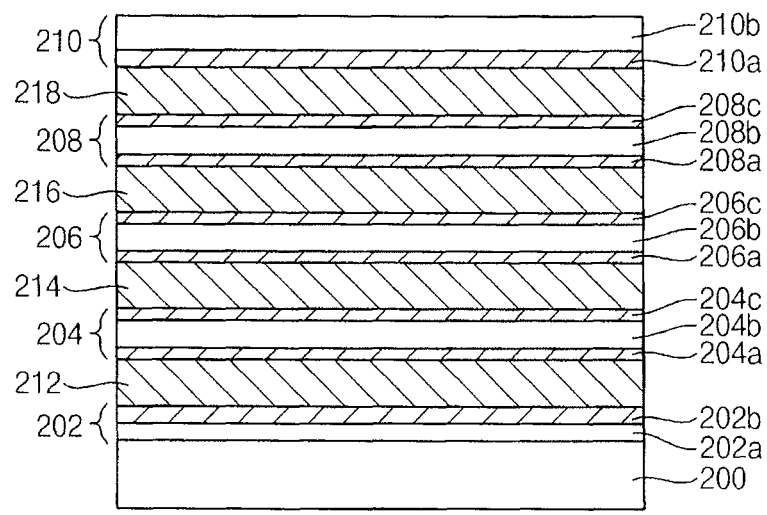
FIGS. 5A-5L are cross-sectional views of a method of forming a vertical-channel memory device, in accordance with another embodiment of the present invention.

Referring to FIG. 5A, a substrate 200 is prepared. In one embodiment, the substrate 200 comprises a single-crystal semiconductor material substrate that provides a seed layer for later formation of the single-crystal vertical channels 230. Multiple alternating interlayer dielectric layers 202, 204, 206, 208, 210, . . . and sacrificial layers 212, 214, 216, 218, . . . are formed on the substrate 200. In the present embodiment, the interlayer dielectric layers 202, 204, 206, 208, 210, . . . each comprise a multiple-layered structures. For example, the lowermost interlayer dielectric layer 202 comprises a lower insulating layer 202a comprising silicon oxide and an upper interlayer dielectric layer comprising silicon nitride. Similarly, the uppermost interlayer dielectric layer 210 comprises a lower insulating layer 202a comprising silicon nitride and an upper interlayer dielectric layer comprising silicon oxide. The interlayer dielectric layers between the lowermost interlayer dielectric layer 202 and the uppermost interlayer dielectric layer 210, including interlayer dielectric layers 204, 206, 208 each comprise a lower insulating layer 204a, 206a, 208a comprising silicon nitride, an intermediate insulating layer 204b, 206b, 208b comprising silicon oxide and an upper insulating layer 204c, 206c, 208c comprising silicon nitride. In this manner, the lower and upper insulating layers comprise a material that has etch selectivity relative to the intermediate insulating layer. In this embodiment, the sacrificial layers 212, 214, 216, 218, . . . can comprise a material that has etch selectivity relative to both silicon oxide and silicon nitride, for example, polysilicon germanium. In this manner, the sacrificial layers 212, 214, 216, 218, . . . can readily be removed by a wet etching process during subsequent fabrication steps.

Figure 5B:
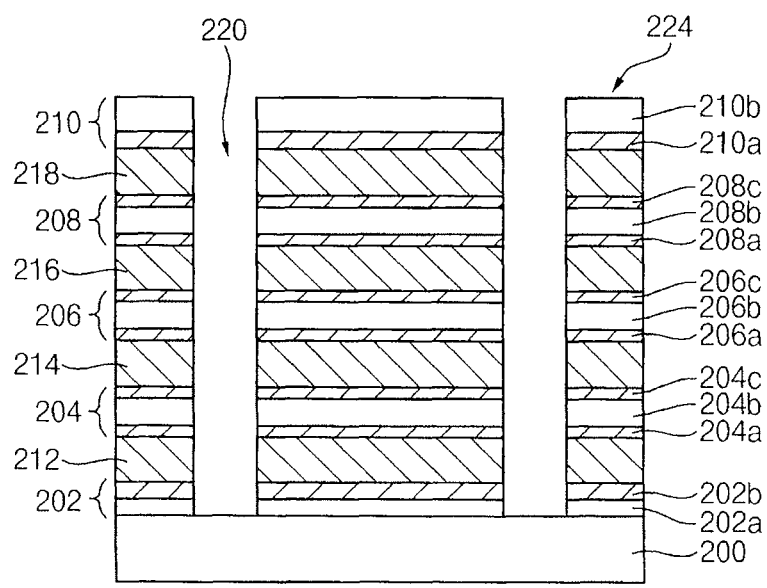

Referring to FIG. 5B, first openings 220 are formed through the interlayer dielectric layers 202, 204, 206, 208, 210, . . . and the sacrificial layers 212, 214, 216, 218, . . . in a vertical direction, and spaced apart in a horizontal direction, as shown. The first openings 220 expose upper portions of the underlying substrate 100 to provide a patterned resulting structure 224.

Figure 5C:
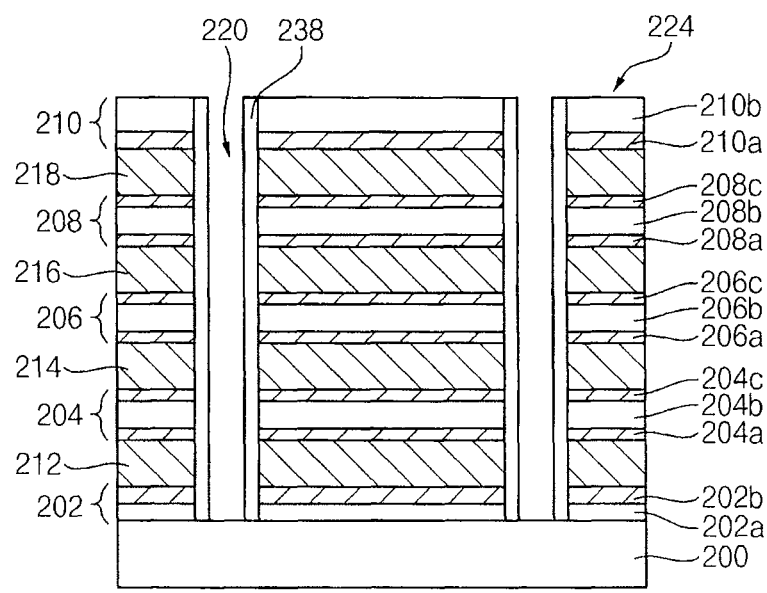

Referring to FIG. 5C, silicon oxide spacers 238 are formed on inner sidewalls of the first openings 220 of the resulting structure 224. The spacers 238 operate to promote substantially uniform formation of the single-crystal silicon vertical channels using the LEG formation process or to promote substantially uniform growth of the single-crystal silicon vertical channels using the SEG formation process, as described above. The spacers prevent crystalline defect formation in the single-crystal silicon that might otherwise be introduced at any oxide-nitride interface in the resulting structure 224.

Figure 5D:
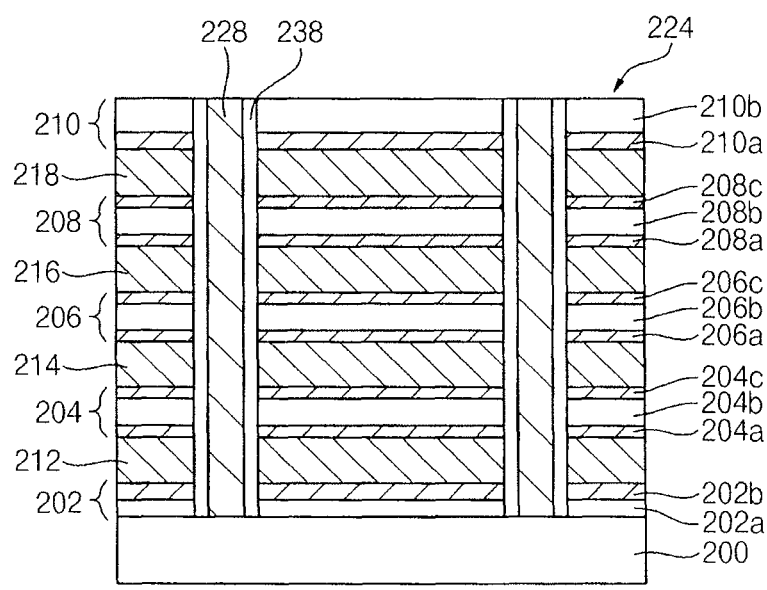

Referring to FIG. 5D, a first poly-silicon layer 228 or first amorphous silicon layer 228 is formed in the first openings 220, in contact with the exposed upper portions of the substrate 200. In one embodiment, the first poly-silicon layer 228 or first amorphous silicon layer 228 can be formed by a chemical-vapor deposition (CVD) process; however, other suitable processes for forming the first poly-silicon layer 228 or first amorphous silicon layer 228 may be applied. In one embodiment, the first poly-silicon layer 228 or first amorphous silicon layer 228 can be doped with impurities at this stage, for example, doped with n-type impurities.

Figure 5E:
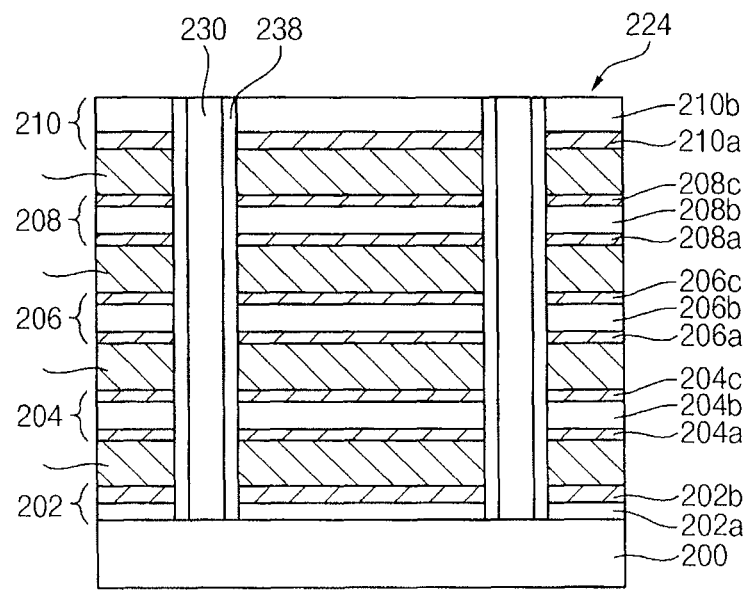

Referring to FIG. 5E, a heat treatment is applied to the first poly-silicon layer 228 or first amorphous silicon layer 228 to convert the layer to a single-crystal silicon pattern 230, that has the same crystal orientation as that of the underlying substrate 200. In one example embodiment, the heat-treatment can take the form of a laser-induced epitaxial growth (LEG) process to obtain the single-crystal silicon pattern 230, as is known in the art.

In an alternative embodiment, single-crystal silicon patterns 230 can be grown in the openings 220 of FIG. 5C from the upper surface of the substrate 200 using a selective epitaxial growth (SEG) process, as described above.

Figure 5F:
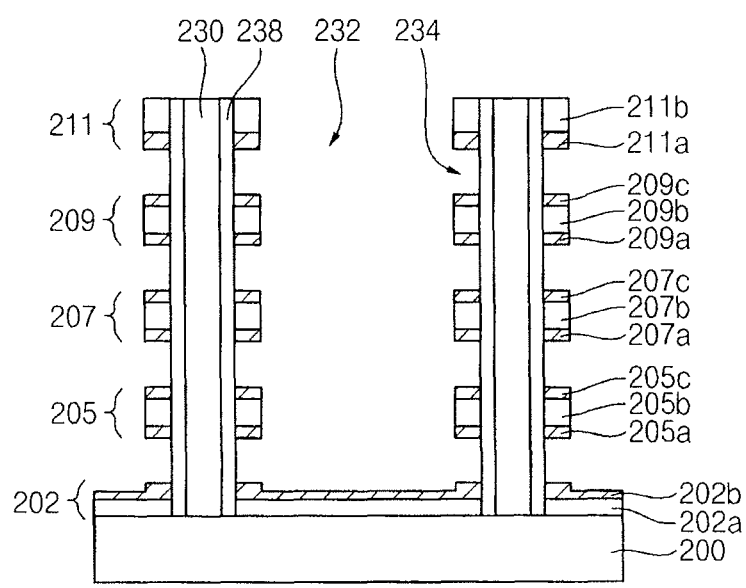

Referring to FIG. 5F, an optional chemical-mechanical polishing (CMP) process can be performed on the upper surface of the resulting structure to remove and planarized an upper portion of the single-crystal silicon patterns 230. A plurality of second openings 232 are then formed between neighboring single-crystal silicon patterns 230, to thereby form interlayer dielectric layer patterns 205a, 205b, 205c, 205d, 205e, . . . and corresponding sacrificial layer patterns. In one embodiment, the second openings 232 expose the lowermost interlayer dielectric layer pattern 202. This procedure permits access to a region where the control gates and floating gates of the resulting memory device will be formed along the vertical channels 230. The sacrificial layer patterns 212, 214, 216, 218, . . . are then removed by a wet etching process. In an example where the sacrificial layer patterns 212, 214, 216, 218, . . . are formed of polysilicon germanium, the etchant of the wet etching process can comprise an oxidizer A/HF mixture solution.

Figure 5G:
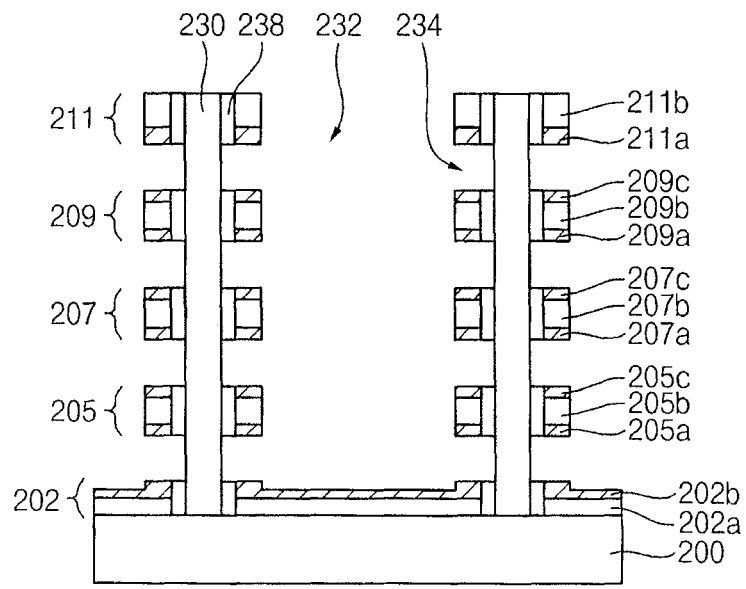

Resulting concave openings 234 surround the walls of the single-crystal silicon patterns 230, to expose the spacers 238 at the sides thereof. Referring to FIG. 5G, exposed portions of the spacers 238 are next removed, for example using a wet etching process. In an embodiment where the spacers comprise silicon oxide, the etchant of the wet etching process can comprise an HF solution.

At this time, impurity doping can be performed at the exposed sidewalls of the single-crystal silicon patterns 230, as described above in connection with FIG. 3I. The resulting channel regions are "self-aligned" in the vertical channels 230 as a result of the respective positions of the interlayer dielectric layer patterns 205a, 205b, 205c, 205d, 205e, . . .

Figure 5H:
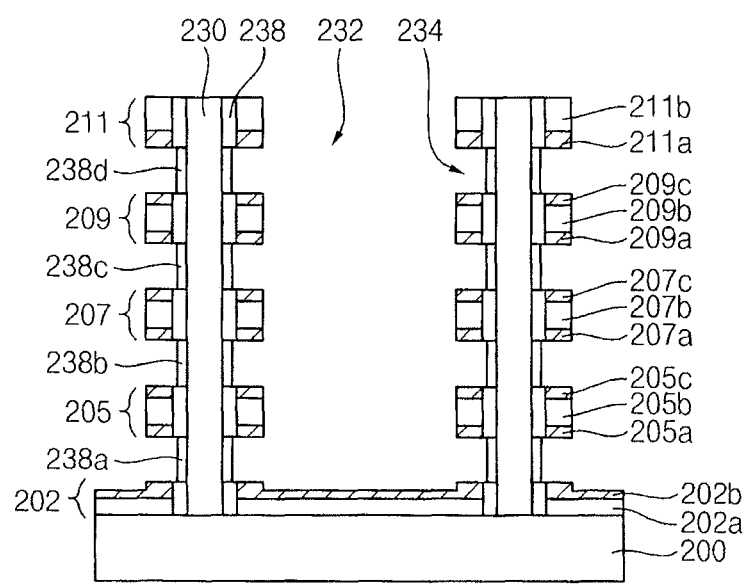

Referring to FIG. 5H, tunnel oxide layers 238a, 238b, 238c, 238d, . . . are formed at the exposed sidewalls of the resulting vertical channels 230. The tunnel oxide layers 238a, 238b, 238c, 238d, . . . surround the vertical channels, for example, in a case where the vertical channels 230 are circular in cross-section, the tunnel oxide layers 238a, 238b, 238c, 238d, . . . are ring-shaped. In one embodiment, the tunnel oxide layers 238a, 238b, 238c, 238d, . . . are formed using a thermal oxidation process. A tunnel oxide layer formed using a thermal oxidation process is more resistant to degradation over time, leading to improved device reliability and endurance.

Figure 5I:
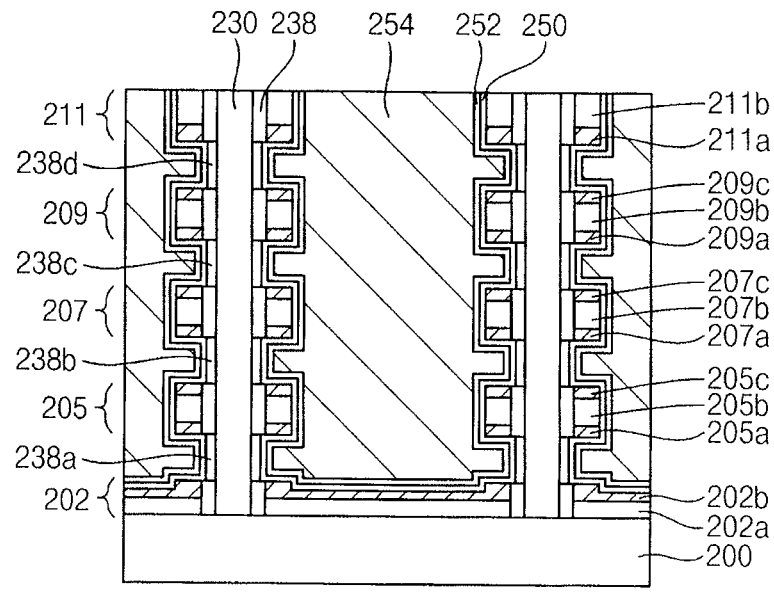

Referring to FIG. 5I, a charge trapping layer 250 is applied to the resulting structure, coating the walls of the concave openings 234, including the interlayer dielectric layer patterns 205, 207, 209, 211, . . . and the tunnel oxide layers 238a, 238b, 238c, 238d, . . .

In various embodiments, the charge trapping layer 250 can be a floating-gate structure, for example, comprising a polysilicon material. In other embodiments, the charge trapping layer 250 can comprise an ONO (oxide-nitride-oxide) structure. Other charge trapping layer 250 structures can also be employed, including nitride, polysilicon, or quantum-dot structures, or other applicable charge trapping structures. A floating-gate charge trapping layer 250 is possible in the embodiments of the present invention, since access is gained behind the tunnel oxide layers 238a, 238b, 238c, 238d, . . . at the concave openings 234. A blocking insulating layer 252 is formed on the resulting structure, covering the charge trapping layer 250. In one example embodiment, the blocking oxide layer 252 comprises silicon oxide, or other suitable high-k oxide layer. A conductive material is provided to fill the second openings 232, including the concave openings 234, resulting in the formation of conductive patterns 254. In one embodiment, the conductive material comprises tungsten silicide.

Figure 5J:
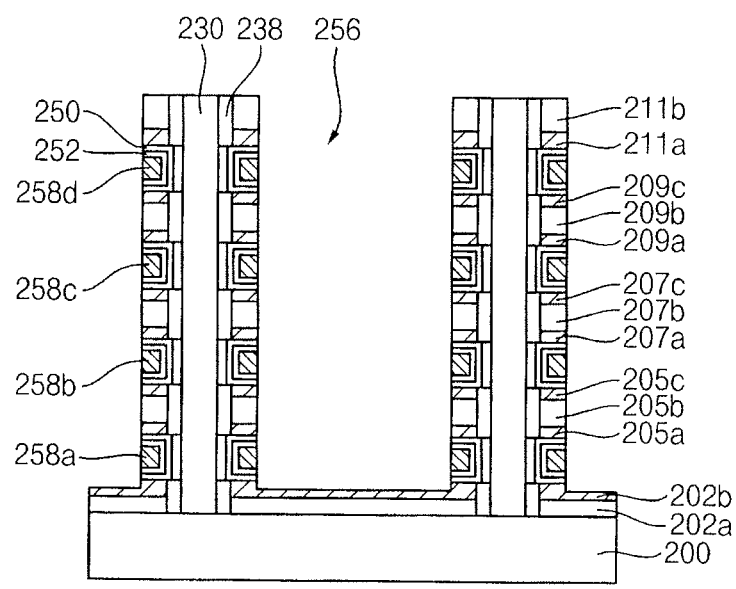

Referring to FIG. 5J, the central portions of the conductive patterns 254 are etched, forming third openings 256 that expose the surface of the lowermost interlayer dielectric layer 202, and expose outer sidewalls of the interlayer dielectric layer patterns 205, 207, 209, 211, . . . This separates portions of the conductive patterns 254 that fill the concave openings 234 into gate patterns 258a, 258b, 258c, 258d, . . . , and separates the charge trapping layer into individual charge trapping layer patterns 250.

Figure 5K:
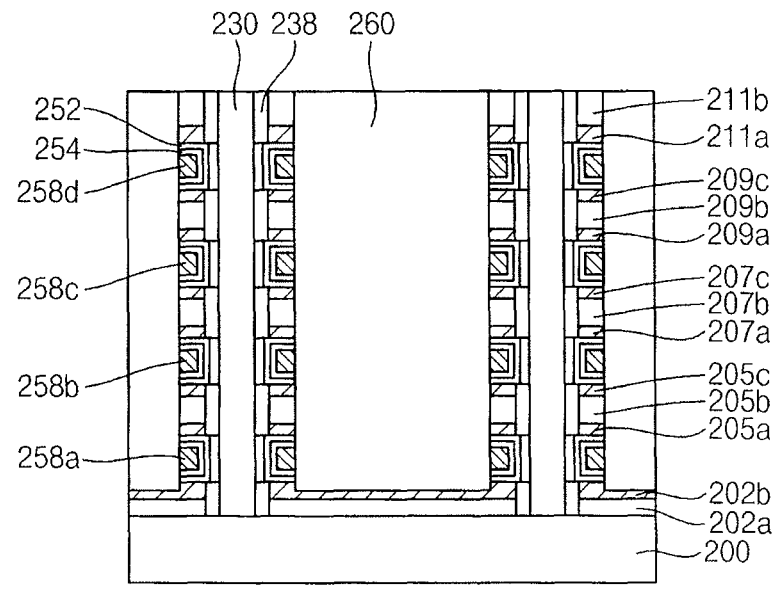

Referring to FIG. 5K, the third openings 256 are filled with an insulation pattern 260.

Figure 5L:
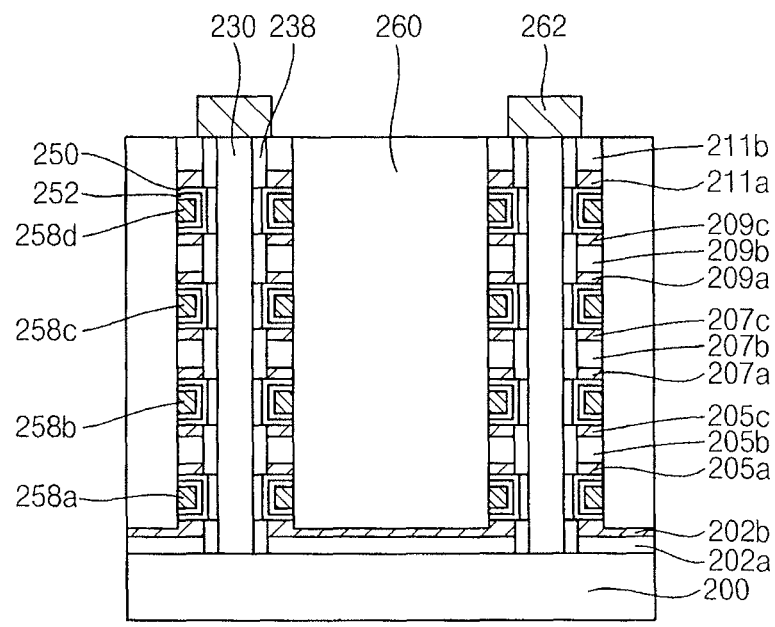

Referring to FIG. 5L, conductive bit lines 262 are formed and patterned to connect neighboring vertical channels 230 in a second horizontal direction of the semiconductor device, as described above in connection with FIG. 1.

Figure 6:
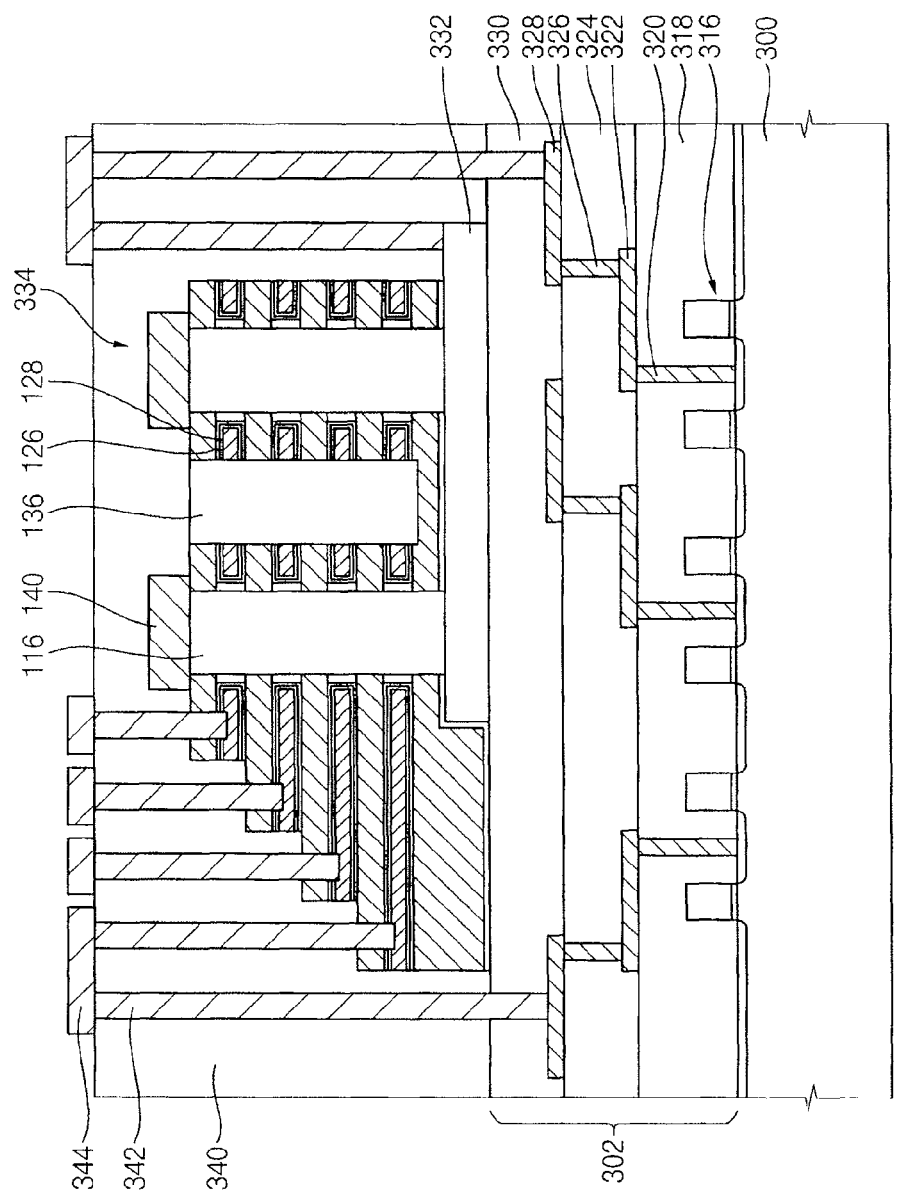
FIG. 6 is cross-sectional view of a vertical-channel memory device, in accordance with another embodiment of the present invention, illustrating positioning of the cell region of the device on the peripheral circuit region of the device.

FIG. 6 is cross-sectional view of a vertical-channel memory device, in accordance with another embodiment of the present invention, illustrating positioning of the cell region of the device on the peripheral circuit region of the device. Referring to FIG. 6, a cell structure 334 is formed on a peripheral circuit region 302 of the device. In this embodiment, a plurality of peripheral circuit transistors 316 are provided on a substrate 300. A first interlayer dielectric (ILD) layer 318 is on the peripheral circuit transistors, and first interlayer contacts 320 connect the underlying transistors 316 with conductive vias 322 formed on the first ILD 318. Similarly, second and third ILD layers 324, 330, and corresponding second interlayer contacts 326, and second and third conductive vias 322, are provided to route the signals between the cell structure 334 and the peripheral circuit region 302.

A cell structure 334 including a single-crystal silicon substrate 332 of the type described above in connection with FIGS. 1, 2 and 3E-3P is positioned on the third ILD layer 330 of the peripheral circuit region 302. A fourth ILD 340 is provided on the resulting structure and interlayer contacts 342 and conductive vias 344 route signals to and from the cell structure 334, including the word line signals and the bit line signals.

FIGS. 7A-7E are cross-sectional views of a method of forming the vertical-channel memory device of FIG. 6, in accordance with another embodiment of the present invention, illustrating the formation of the cell region of the device on the peripheral circuit region of the device.

Figure 7A:
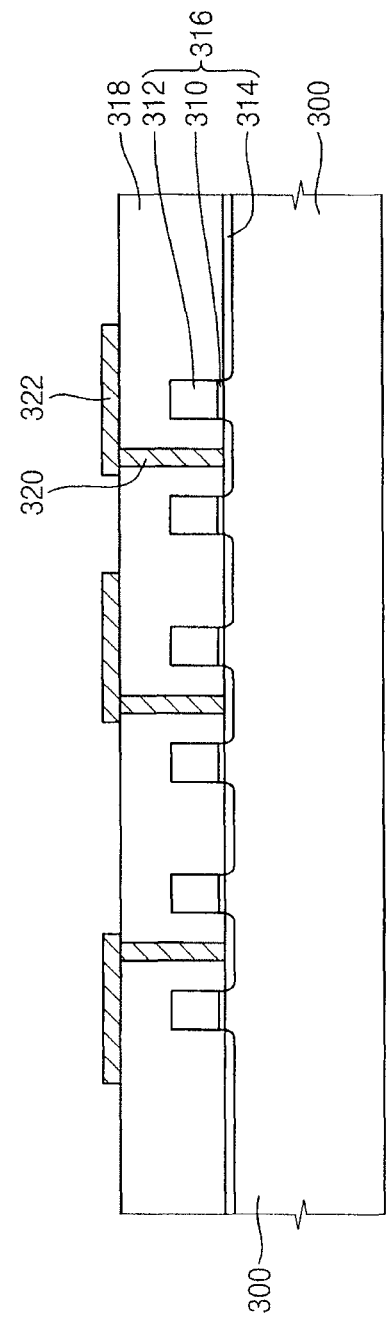
FIGS. 7A-7E are cross-sectional views of a method of forming the vertical-channel memory device of FIG. 6, in accordance with another embodiment of the present invention, illustrating the formation of the cell region of the device on the peripheral circuit region of the device.

Referring to FIG. 7A, a plurality of peripheral circuit transistors 316 are provided on a substrate 300. The transistors include, for example, a gate electrode 312, isolated from the substrate 300 by a gate oxide layer 310, and source and drain regions in the substrate at sides of the gate electrode. A first interlayer dielectric (ILD) layer 318 is formed on the peripheral circuit transistors, and first interlayer contacts 320 connect the underlying transistors 316 with conductive vias 322 form on the first ILD 318.

Figure 7B:
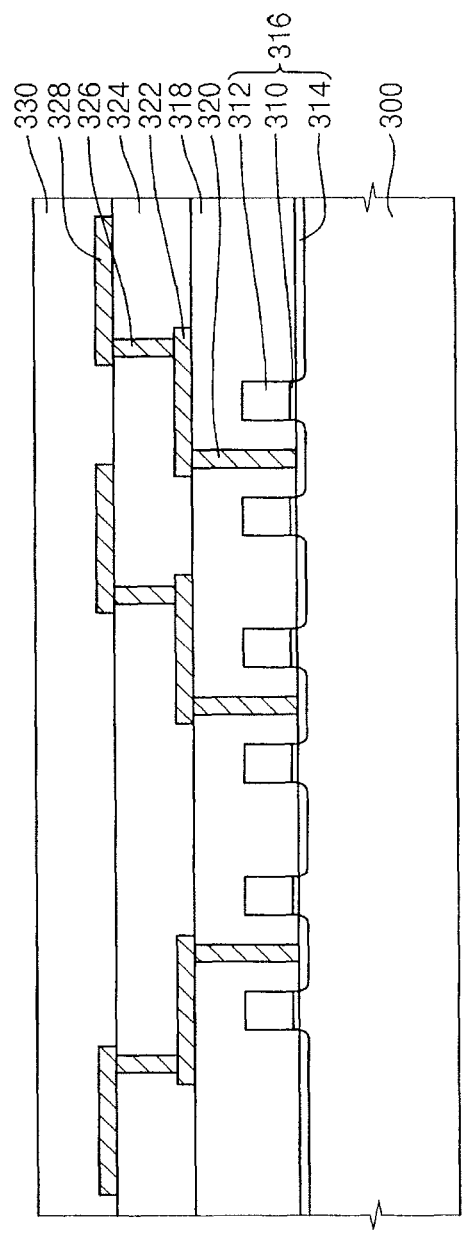

Referring to FIG. 7B, second and third ILD layers 324, 330, and corresponding second interlayer contacts 326, and second and third conductive vias 322, are formed on the resulting structure to route the signals to and from the peripheral circuit region 302.

Figure 7C:
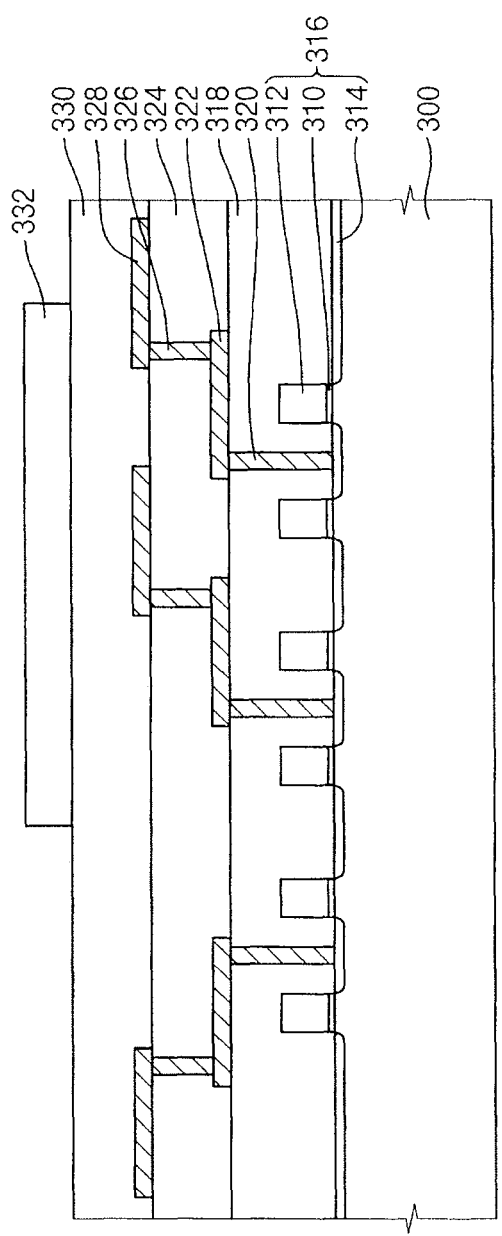

Referring to FIG. 7C, a single crystal silicon layer 332 is formed on the resulting structure. The single-crystal silicon layer 332 provides a function for the later formed cell region that is similar to the substrate 100 of FIGS. 1, 2 and 3A-3P.

Figure 7D:
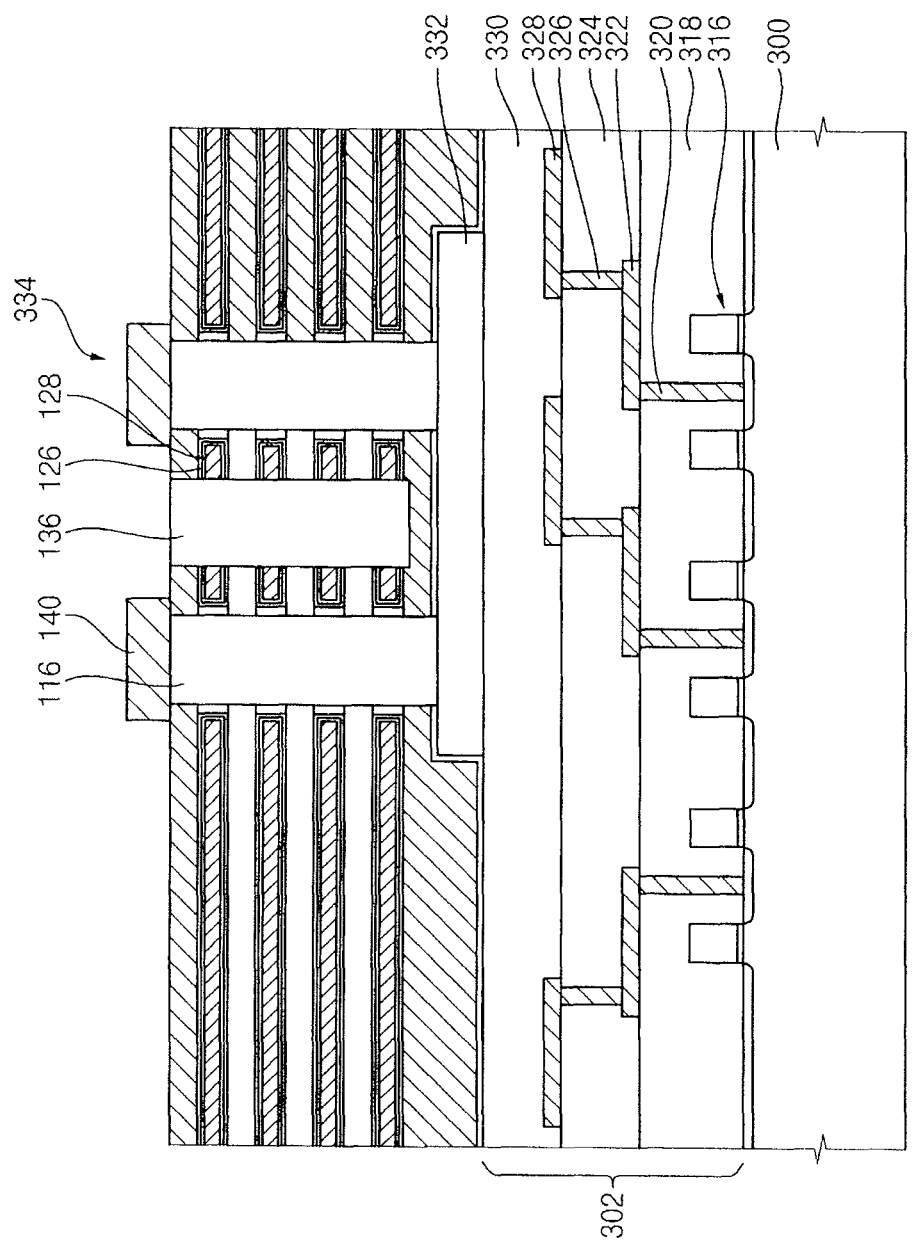

Referring to FIG. 7D, a cell structure 334 is formed on the single crystal silicon layer 332, for example in the manner described above in connection with FIGS. 1, 2 and 3A-3P.

Figure 7E:
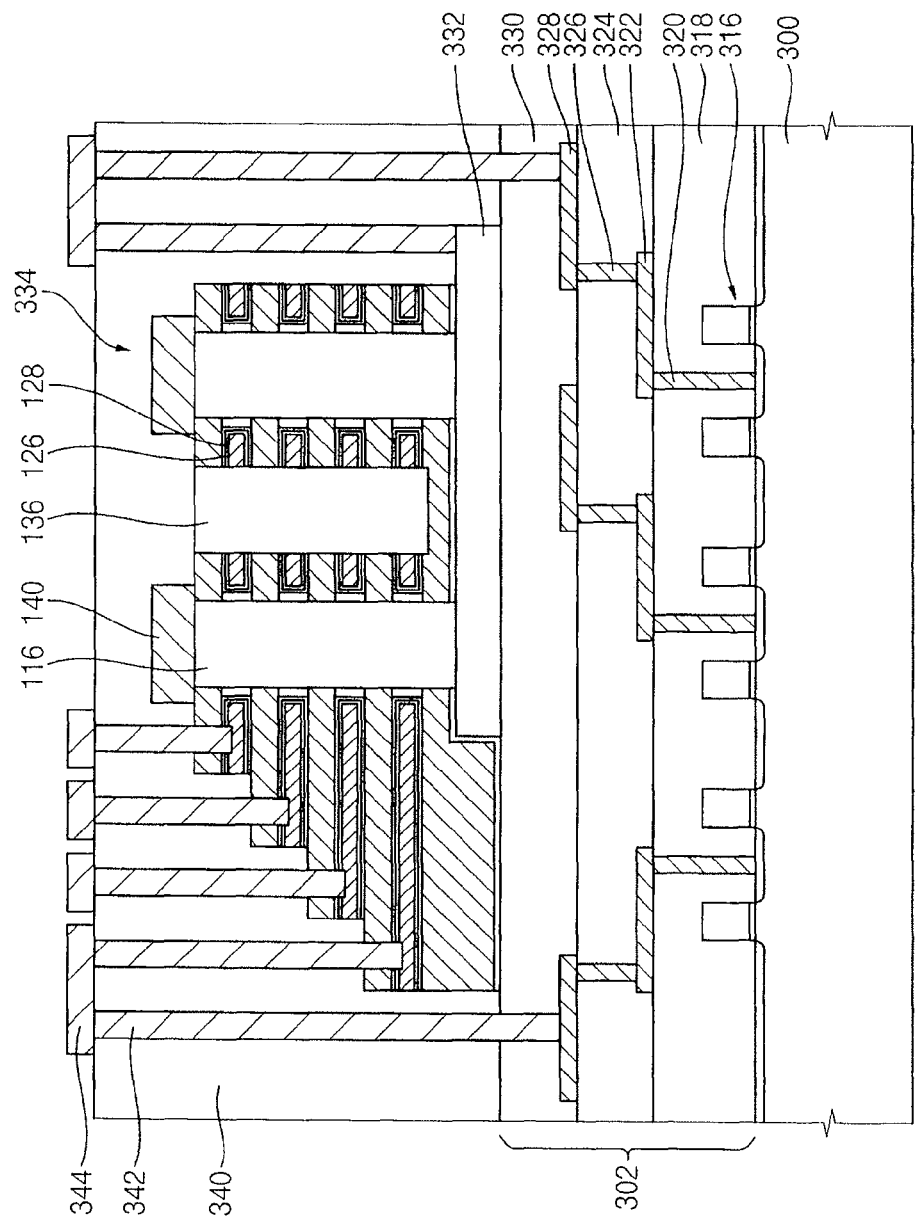

Referring to FIG. 7E, the resulting structure is patterned in a cascade arrangement, to provide access to the word lines of the various cell layers as shown. A fourth ILD layer 340 is applied to the resulting structure, as described above and interlayer contacts 342 and conductive vias 344 are patterned and formed to route signals to and from suitable nodes of the cell structure 334, including the word line signals and the bit line signals.

Figure 8:
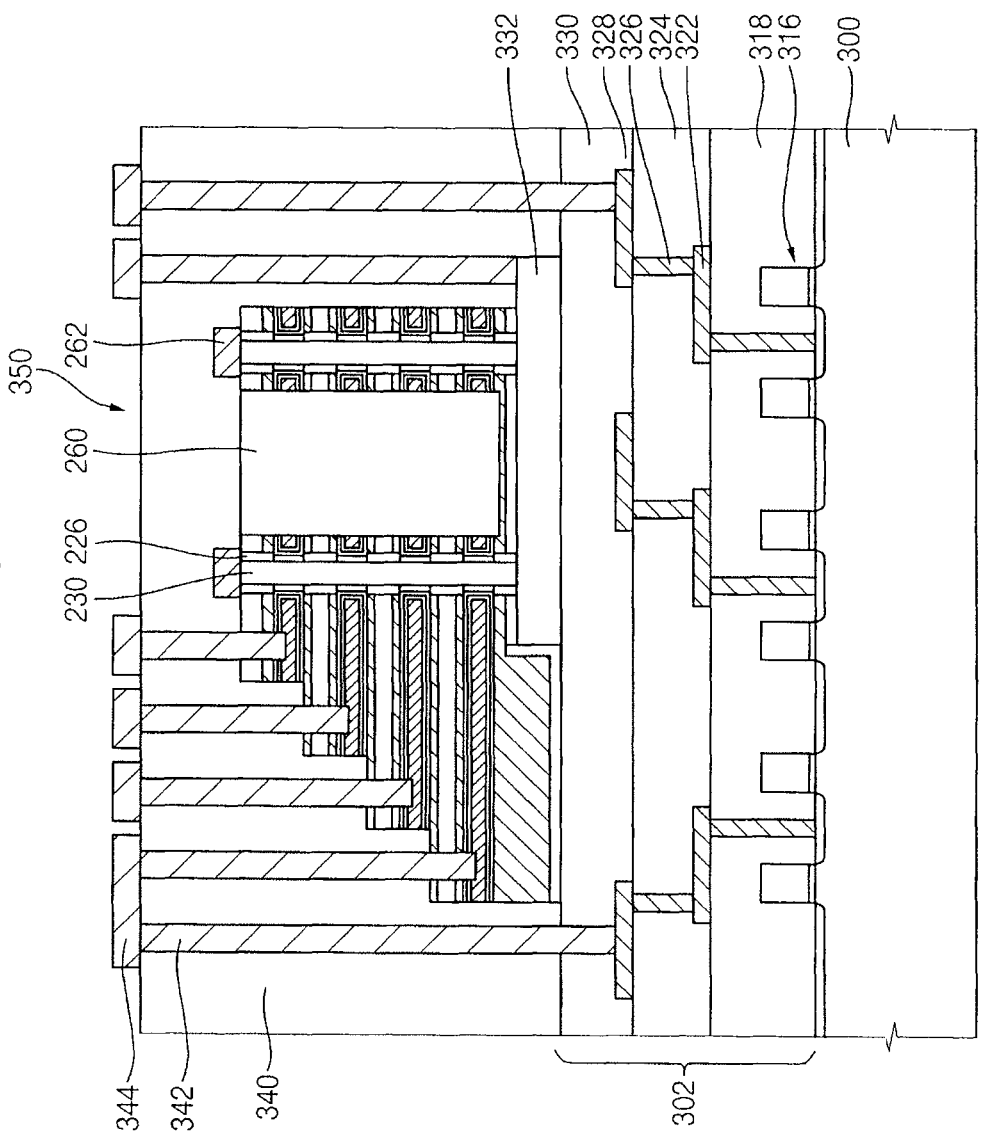
FIG. 8 is cross-sectional view of a vertical-channel memory device, in accordance with another embodiment of the present invention, illustrating positioning of the cell region of the device on the peripheral circuit region of the device.

FIG. 8 is cross-sectional view of a vertical-channel memory device, in accordance with another embodiment of the present invention, illustrating the positioning of the cell region of the device on the peripheral circuit region of the device. In this embodiment, a cell structure 350 of the type described above in connection with FIGS. 4 and 5A-5L is provided on the peripheral circuit region 302 of the device. To accomplish this, the processing steps shown in FIGS. 7A-7E may be performed, using the cell structure of the type shown in FIGS. 4 and 5A-5L.

Accordingly, in vertical-type semiconductor memory devices and methods of forming the same, a single-crystal vertical channel can be employed, thereby reducing the likelihood of crystalline defects, and mitigating the number of resulting trap sites, leading to reduced device resistance, and therefore increased speed and decreased power consumption. Also, a charge trapping layer can be formed to surround the control gate in the region of the vertical channel, leading to simpler and more reliable device formation. Further, the tunnel oxide positioned between the charge trapping layer and the vertical channel can be formed of a thermal oxide layer, which is more resistant to degradation over time, leading to improved device reliability and endurance. This also provides designers with greater flexibility in achieving desired device characteristics.

Figure 10:
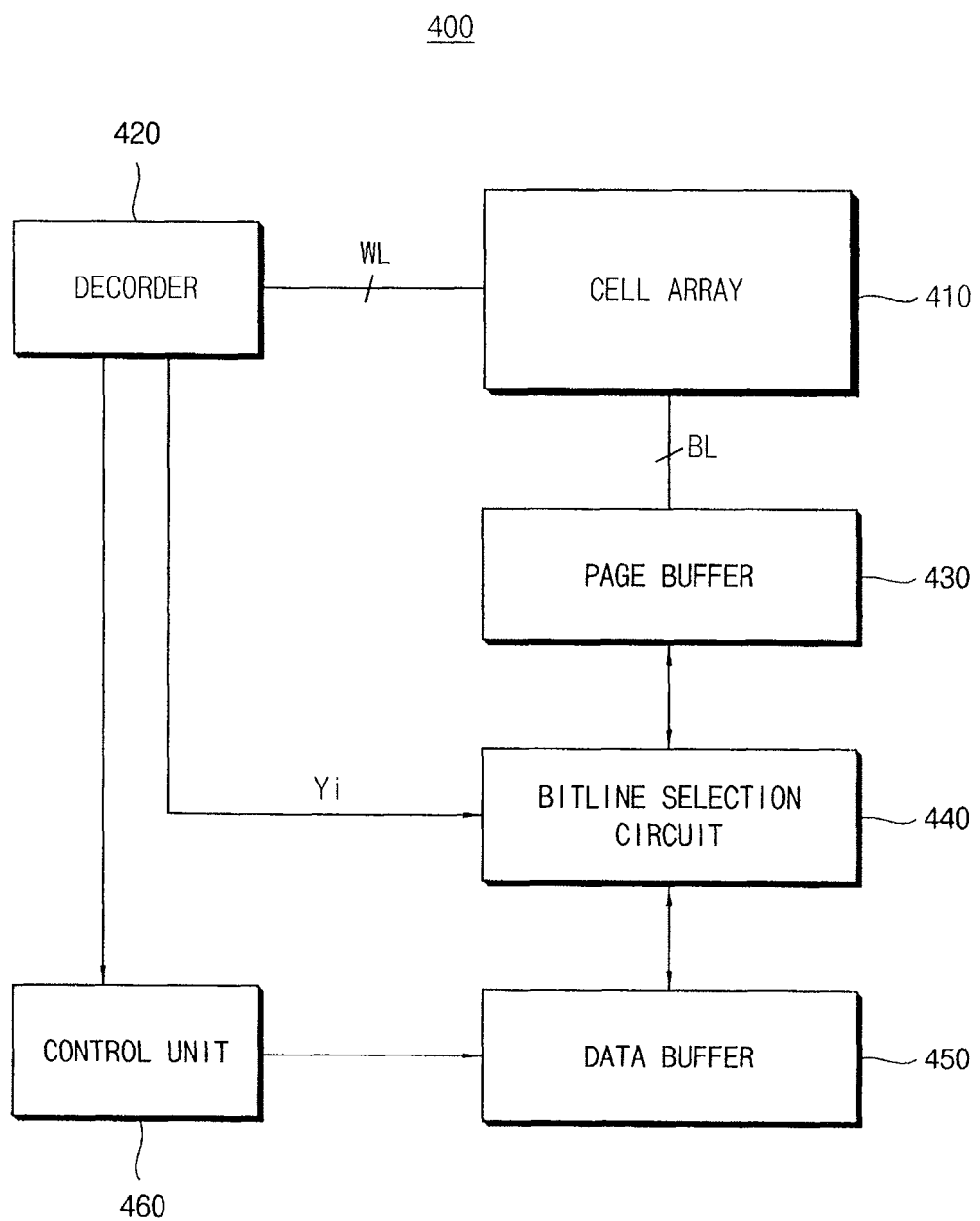
FIG. 10 is a block diagram of a nonvolatile memory device in accordance with exemplary embodiments of the present invention.

FIG. 10 is a block diagram of a nonvolatile memory device in accordance with exemplary embodiments of the present invention.

Referring to FIG. 10, a semiconductor memory device 400 may include a cell array 410, a decoder 420, a page buffer 430, a bit line selection circuit 440, a data buffer 450 and a control unit 460. The semiconductor memory device 400 may comprise a vertical-type non-volatile flash memory device configured in accordance with the embodiments described herein.

The cell array 410 may include a plurality of memory blocks (not shown). Each memory block can include a plurality of pages (e.g., 32 pages, 64 pages) and each page can include a plurality of memory cells (e.g., 512B, 2 KB) sharing one word line (WL). In one example, erase operations can be performed on a memory block basis, and read and write operations can be performed on a page basis.

The decoder 420 is connected to the cell array 410 by a plurality of word lines WL and controlled by the control unit 460. The decoder 420 receives an address (ADDR) from a memory controller (not shown) and generates a selection signal Yi so as to select a word line or a bit line. The page buffer 430 is connected to the cell array 410 by a plurality of bit lines BL.

The page buffer 430 stores data loaded from a buffer memory (not shown). The page buffer 430 loads page data and the loaded data is simultaneously programmed to a selection page when a program operation is performed. When a read operation is performed, the page buffer 430 reads data from a selection page and temporarily stores the read data. Data stored in the page buffer 430 is transferred to the buffer memory in response to a read enable signal.

The bit line selection circuit 440 responds to the selection signal Yi and selects a bit line (BL). The data buffer 450 is an input/output buffer used for transmitting data between a memory controller and the flash memory device 400. The control unit 460 receives a control signal from the memory controller and controls an internal operation of the flash memory device 400.

Figure 11:
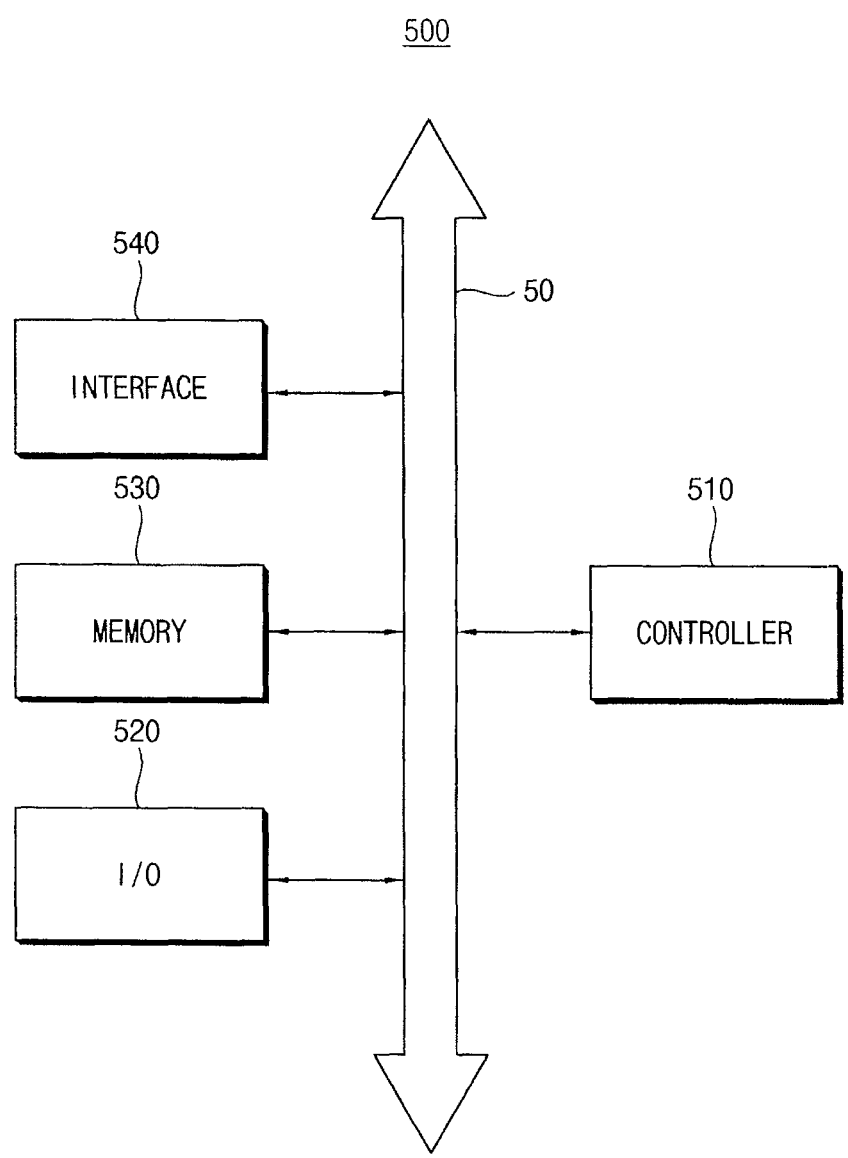
FIG. 11 is a block diagram of a system including a semiconductor memory device in accordance with exemplary embodiments of the present invention.

FIG. 11 is a block diagram of a system 500 including a semiconductor memory device in accordance with exemplary embodiments of the present invention. The system 500 may, for example, be employed in a wireless communication device (e.g., PDA, a laptop computer, a portable computer, a web tablet, a wireless phone and a cell phone), or in an electronic device that can transmit and/or receive information in a wireless environment.

The system 500 may include a controller 510, an input/output device 520 such as a keypad, keyboard and a display, a memory 530, and a wireless interface 540. The controller 510 may include at least one microprocessor, digital signal processor, microcontroller or the like. The memory 530 may be used for storing an instruction code executed by the controller 510 and used for storing user data. The memory 530 can comprise a vertical-type nonvolatile memory device in accordance with some exemplary embodiments of the present invention. The memory 530 can also comprise various kinds of vertical-type memories, including vertical-type random access volatile memory.

The system 500 may use a wireless interface 540 to transfer data to a wireless communication network that communicates by RF signal or to receive data from the wireless communication network that communicates by RF signal. For example, the wireless interface 540 may include an antenna, a wireless transceiver and other wireless system elements.

The system 500 according to some exemplary embodiments of the present invention may be used in a communication protocol such as a third generation communication system (e.g., CDMA, GSM, NADC, E-TDMA, WCDMA or CDMA3000)

While embodiments of the invention have been particularly shown and described with references to preferred embodiments thereof, it will be understood by those skilled in the art that various changes in form and details may be made herein without departing from the spirit and scope of the invention as defined by the appended claims.

What is claimed is:

1. A semiconductor device, comprising:
a plurality of interlayer dielectric layers on a substrate;
a plurality of gate patterns, each gate pattern between a neighboring lower interlayer dielectric layer and a neighboring upper interlayer dielectric layer;
a vertical channel extending in a vertical direction through the plurality of interlayer dielectric layers and the plurality of gate patterns;
a gate insulating layer between each gate pattern and the vertical channel that insulates the gate pattern from the vertical channel; and
a blocking layer between each corresponding gate pattern and the vertical channel, the blocking layer comprising:
a first portion extending in the vertical direction between the gate pattern and the gate insulating layer;
a second portion extending in a horizontal direction between the gate pattern and the neighboring upper interlayer dielectric layer; and
a third portion extending in the horizontal direction between the gate pattern and the neighboring lower interlayer dielectric layer.

2. The semiconductor device of claim 1, wherein the blocking layer includes silicon oxide or other suitable high-k oxide layer.

3. The semiconductor device of claim 1, wherein the blocking layer covers three sides of at least one of the plurality of gate patterns.

4. The semiconductor device of claim 1, further comprising a charge trapping layer positioned between each corresponding gate insulating layer and blocking layer.

5. The semiconductor device of claim 4, wherein the charge trapping layer includes ONO, nitride, or quantum-dot structures.

6. The semiconductor device of claim 1, wherein the gate insulating layer is disposed at the side wall of the vertical channel.

7. The semiconductor device of claim 1, wherein the gate insulating layer includes a thermal oxide layer.

8. The semiconductor device of claim 1 wherein:
an upper-most gate pattern of the plurality of gate patterns comprises an upper select gate of an upper select transistor;
a lower-most gate pattern of the plurality of gate patterns comprises a lower select gate of a lower select transistor;
remaining gate patterns of the plurality of gate patterns between the upper select gate and the lower select gate comprise control gates of memory cell transistors of a common string of the semiconductor device;
control gates of memory cell transistors sharing a same layer of the device arranged in a first horizontal direction of the semiconductor device are connected to provide word lines of the semiconductor device;
memory cell transistors of a common string of the semiconductor device are coupled together in series by the vertical channel;

upper portions of vertical channels arranged in a second horizontal direction of the semiconductor device are connected to provide bit lines of the semiconductor device; and the semiconductor device comprises a semiconductor memory device.

9. The semiconductor device of claim 1, wherein the interlayer dielectric layer includes a silicon oxide layer.

10. The semiconductor device of claim 1 wherein the plurality of interlayer dielectric layers each comprise a multiple-layered structure comprising a lower insulating layer, an intermediate insulating layer and an upper insulating layer, the lower and upper insulating layers comprising a material that has etch selectivity relative to the intermediate insulating layer.

11. A semiconductor device, comprising:
a plurality of interlayer dielectric layers on the substrate;
a plurality of gate patterns, each gate pattern between a neighboring lower interlayer dielectric layer and a neighboring upper interlayer dielectric layer;
a vertical channel extending in a vertical direction through the plurality of interlayer dielectric layers and the plurality of gate patterns;
a gate insulating layer between each gate pattern and the vertical channel that insulates the gate pattern from the vertical channel; and
a blocking layer between each corresponding gate pattern and the vertical channel, wherein the blocking layer covers three sides of at least one of the gate pattern.

12. The semiconductor device of claim 11, wherein the blocking layer includes silicon oxide or other suitable high-k oxide layer.

13. The semiconductor device of claim 11, wherein the blocking layer comprises:
a first portion extending in the vertical direction between the gate pattern and the gate insulating layer;
a second portion extending in a horizontal direction between the gate pattern and the neighboring upper interlayer dielectric layer; and
a third portion extending in the horizontal direction between the gate pattern and the neighboring lower interlayer dielectric layer.

14. The semiconductor device of claim 11, further comprising a charge trapping layer between each corresponding gate insulating layer and blocking layer.

15. The semiconductor device of claim 14, wherein the charge trapping layer includes ONO, nitride, or quantum-dot structures.

16. The semiconductor device of claim 11, wherein the gate insulating layer is disposed at the side wall of the vertical channel.

17. The semiconductor device of claim 11, wherein the gate insulating layer includes a thermal oxide layer.

18. The semiconductor device of claim 11 wherein:
an upper-most gate pattern of the plurality of gate patterns comprises an upper select gate of an upper select transistor;
a lower-most gate pattern of the plurality of gate patterns comprises a lower select gate of a lower select transistor;
remaining gate patterns of the plurality of gate patterns between the upper select gate and the lower select gate comprise control gates of memory cell transistors of a common string of the semiconductor device;
control gates of memory cell transistors sharing a same layer of the device arranged in a first horizontal direction of the semiconductor device are connected to provide word lines of the semiconductor device;
memory cell transistors of a common string of the semiconductor device are coupled together in series by the vertical channel;
upper portions of vertical channels arranged in a second horizontal direction of the semiconductor device are connected to provide bit lines of the semiconductor device; and
the semiconductor device comprises a semiconductor memory device.

19. The semiconductor device of claim 11, wherein the interlayer dielectric layer includes a silicon oxide layer.

20. The semiconductor device of claim 11, wherein the plurality of interlayer dielectric layers each comprise a multiple-layered structure comprising a lower insulating layer, an intermediate insulating layer and an upper insulating layer, the lower and upper insulating layers comprising a material that has etch selectivity relative to the intermediate insulating layer.

* * * * *